US011624797B2

(12) United States Patent
Guo et al.

(10) Patent No.: US 11,624,797 B2
(45) Date of Patent: *Apr. 11, 2023

(54) METHOD, DEVICE AND MRI SYSTEM FOR CORRECTING PHASE SHIFTS

(71) Applicant: SHANGHAI UNITED IMAGING HEALTHCARE CO., LTD., Shanghai (CN)

(72) Inventors: Yanen Guo, Shanghai (CN); Zhongqi Zhang, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 12 days.

This patent is subject to a terminal disclaimer.

(21) Appl. No.: 17/180,842

(22) Filed: Feb. 21, 2021

(65) Prior Publication Data

US 2021/0215783 A1     Jul. 15, 2021

Related U.S. Application Data

(63) Continuation of application No. 16/057,898, filed on Aug. 8, 2018, now Pat. No. 10,935,619.

(30) Foreign Application Priority Data

Aug. 8, 2017 (CN) ......................... 201710672602.5

(51) Int. Cl.
*G06T 7/269* (2017.01)
*G01R 33/565* (2006.01)
(Continued)

(52) U.S. Cl.
CPC ... *G01R 33/56545* (2013.01); *G01R 33/5608* (2013.01); *G01R 33/56518* (2013.01);
(Continued)

(58) Field of Classification Search
CPC .......... G01R 33/56545; G01R 33/5608; G01R 33/56518; G06T 5/002; G06T 5/50;
(Continued)

(56) References Cited

U.S. PATENT DOCUMENTS 7,696,753 B2 * 4/2010 Nozaki ............ G01R 33/56563
324/307
7,805,003 B1 * 9/2010 Cohen .................. G06V 30/414
382/173
(Continued)

FOREIGN PATENT DOCUMENTS

CN      103885014 A    6/2014
CN      104569882 A    4/2015
(Continued)

OTHER PUBLICATIONS

Zhu, Ante, Research on Inner-out Plane Echo Imaging Technology, China Excellent Master's Thesis Full-text Database, 12(5), 80 pages, 2015.
(Continued)

*Primary Examiner* — Solomon G Bezuayehu
(74) *Attorney, Agent, or Firm* — Metis IP LLC

(57) ABSTRACT

A system and method for correcting phase shift in echo images are provided. The method may include one or more of the following operations. A plurality of echo images may be obtained. Homogeneous pixels in the plurality of echo images may be identified. A vector corresponding to each of at least some of the identified homogeneous pixels may be determined. A vector of a homogenous pixel includes a phase element and an amplitude element. A first complex linear model of phase shift may be determined based at least in part on the determined vectors. Phase shift of at least one of the plurality of echo images may be corrected based on the first complex linear model.

16 Claims, 17 Drawing Sheets

(51) Int. Cl.
*G01R 33/56* (2006.01)
*G06T 5/50* (2006.01)
*G06T 7/246* (2017.01)
*G06T 5/00* (2006.01)

(52) U.S. Cl.
CPC ............ *G06T 5/002* (2013.01); *G06T 5/50* (2013.01); *G06T 7/251* (2017.01); *G06T 7/269* (2017.01); *G06T 2207/10088* (2013.01); *G06T 2207/30168* (2013.01)

(58) Field of Classification Search
CPC .............. G06T 7/251; G06T 7/269; G06T 2207/10088; G06T 2207/30168
See application file for complete search history.

(56) References Cited

U.S. PATENT DOCUMENTS

| | | | |
|---|---|---|---|
| 2004/0041563 A1* | 3/2004 | Lewin | G01R 33/565 324/309 |
| 2004/0223640 A1* | 11/2004 | Bovyrin | G06V 10/24 382/154 |
| 2005/0013486 A1* | 1/2005 | Wiedemann | G06V 20/13 382/181 |
| 2005/0237056 A1* | 10/2005 | Nabetani | G01R 33/3415 324/309 |
| 2008/0036460 A1 | 2/2008 | He et al. | |
| 2008/0122942 A1* | 5/2008 | Mimata | H04N 5/357 348/222.1 |
| 2010/0183245 A1* | 7/2010 | Oryoji | H04N 7/014 382/299 |
| 2012/0314945 A1* | 12/2012 | Cha | G06T 3/4038 382/167 |
| 2013/0018265 A1* | 1/2013 | Kim | A61B 8/5269 600/443 |
| 2013/0182932 A1* | 7/2013 | Chen | G06T 11/008 382/131 |
| 2013/0243319 A1* | 9/2013 | Cho | G06T 5/40 382/168 |
| 2015/0161784 A1* | 6/2015 | Ma | G06T 5/00 382/131 |
| 2016/0143617 A1* | 5/2016 | Ebbini | G01S 15/8915 600/447 |
| 2016/0182920 A1* | 6/2016 | Yim | H04N 19/895 375/240.27 |
| 2017/0076043 A1* | 3/2017 | Dormer | G16H 40/67 |
| 2017/0112449 A1* | 4/2017 | Huang | A61B 5/055 |
| 2017/0208345 A1* | 7/2017 | Jeong | H04N 19/70 |
| 2017/0363699 A1* | 12/2017 | Ookawa | G01R 33/543 |
| 2018/0061012 A1* | 3/2018 | Staranowicz | G06T 3/4053 |
| 2018/0089839 A1* | 3/2018 | Li | G06V 20/41 |
| 2018/0198977 A1* | 7/2018 | Okumura | G02B 27/0037 |
| 2018/0256042 A1* | 9/2018 | Beckers | G06T 7/269 |

FOREIGN PATENT DOCUMENTS

| | | |
|---|---|---|
| CN | 106646301 A | 5/2017 |
| JP | 2001292976 A | 10/2001 |

OTHER PUBLICATIONS

Li, Jianqi et al., Phase-corrected Bipolar Gradients in Multiecho Gradient-echo Sequences for Quantitative Susceptibility Mapping, Magnetic Resonance Materials in Physics Biology and Medicine, 28(4), 12 pages, 2015.

First Office Action in Chinese Application No. 201710672602.5 dated May 17, 2019, pages.

\* cited by examiner

METHOD, DEVICE AND MRI SYSTEM FOR CORRECTING PHASE SHIFTS

CROSS REFERENCE TO RELATED APPLICATIONS

This application is a continuation of U.S. application Ser. No. 16/057,898, filed on Aug. 8, 2018, which claims priority to Chinese Application No. 201710672602.5, filed on Aug. 8, 2017, the entire contents of each of which are hereby incorporated herein by reference.

TECHNICAL FIELD

The present disclosure generally relates to magnetic resonance imaging, and more specifically relates to systems and methods for correcting a phase shift in a magnetic resonance image.

BACKGROUND

In a magnetic resonance imaging (MRI) process, echo signals may be generated from a subject in response to a magnetic resonance (MR) sequence, based on which echo images may be generated. In some embodiments, due to noises introduced by an eddy current, for pixels in even echo images, there may be a phase shift. There is a need to provide systems and methods for correcting such a phase shift.

SUMMARY

In a first aspect of the present disclosure, a system for correcting phase shift in echo images may be provided. The system may have at least one at least one computer-readable storage medium including a set of instructions, and at least one processor in communication with the at least one computer-readable storage medium. Wherein when executing the instructions, the at least one processor may be directed to perform a method including one or more of the following operations. A plurality of echo images may be obtained. Homogeneous pixels in the plurality of echo images may be identified. A vector corresponding to each of at least some of the identified homogeneous pixels may be determined. A vector of a homogeneous pixel includes a phase element and an amplitude element. A first complex linear model of phase shift may be determined based at least in part on the determined vectors. Phase shift of at least one of the plurality of echo images may be corrected based on the first complex linear model.

In some embodiments, the identified homogeneous pixels belong to a homogeneous region.

In some embodiments, to identify the homogeneous pixels in the plurality of echo images, the at least one processor may be directed to perform one or more of the following operations. For each pixel of at least some pixels of an echo image of the plurality of echo images, an image gradient of the pixel may be obtained, and whether the pixel may be a homogeneous pixel may be determined based on the image gradient of the pixel and a threshold.

In some embodiments, to obtain the image gradient of the pixel, the at least one processor may be directed to perform one or more of the following operations. A first image gray value of the pixel may be obtained. A second image gray value of a neighboring pixel of the pixel in a first direction, a third image gray value of a neighboring pixel of the pixel in a second direction, and a fourth image gray value of a neighboring pixel of the pixel in a third direction may be obtained. A first image gradient element of the pixel in the first direction may be determined based on a difference between the first image gray value and the second image gray value. A second image gradient element of the pixel in the second direction may be determined based on a difference between the first image gray value and the third image gray value. A third image gradient element of the pixel in the third direction may be determined based on a difference between the first image gray value and the fourth image gray value. The image gradient of the pixel may be determined based on the first image gradient element, the second image gradient element, and the third image gradient element.

In some embodiments, the plurality of echo images include a first pixel and a second pixel. In some embodiments, to identify the homogeneous pixels in the plurality of echo images, the at least one processor may be directed to perform one or more of the following operations. A first image gradient of the first pixel may be obtained. A second image gradient of the second pixel may be obtained. Whether the first pixel and the second pixel are homogeneous pixels may be determined by comparing a difference between the first image gradient and the second image gradient with a threshold.

In some embodiments, the at least one processor may be further directed to obtain a linear model of phase shift. In some embodiments, to determine the first complex linear model based at least in part on the determined vectors, the at least one processor may be directed to determine the first complex linear model based on the linear model of phase shift and the determined vectors.

In some embodiments, to determine the first complex linear model based on the linear model of phase shift and the determined vectors, the at least one processor may be directed to perform one or more of the following operations. At least one parameter of the linear model of phase shift may be determined based on the determined vectors. The first complex linear model may be determined based on the linear model and the at least one parameter.

In some embodiments, to determine the first complex linear model based on the linear model of phase shift and the determined vectors, the at least one processor may be directed to perform one or more of the following operations. The linear model of phase shift may be transformed to a second complex linear model. At least one parameter of the second complex linear model may be determined based on the determined vectors. The first complex linear model may be determined based on the second complex linear model and the at least one parameter.

In some embodiments, the at least one parameter of the second complex linear model comprises at least one first-order parameter. In some embodiments, to determine the at least one coefficient of the second complex linear model based on the determined vectors, the at least one processor may be directed to perform one or more of the following operations. A plurality of complex numbers may be determined based on the second complex linear model and the determined vectors, each complex number corresponding to a homogeneous pixel. A phase corresponding to a sum of the plurality of complex numbers may be determined. The first-order coefficient of the second complex linear model may be determined based on the determined phase.

In some embodiments, the at least one parameter of the second complex linear model further comprises a zeroth-order coefficient. In some embodiments, the at least one processor may be further directed to determine the zeroth-order coefficient of the second complex linear model based on the determined at least one first-order coefficient of the second complex linear model.

In some embodiments, the plurality of echo images correspond to a plurality of echo signals that are generated within one repetition time.

In a second aspect of the present disclosure, a method for correcting phase shift in echo images may be implemented on a system which has at least one at least one computer-readable storage medium including a set of instructions, and at least one processor in communication with the at least one computer-readable storage medium. The method may include one or more of the following operations. A plurality of echo images may be obtained. Homogeneous pixels in the plurality of echo images may be identified. A vector corresponding to each of at least some of the identified homogeneous pixels may be determined. A vector of a homogenous pixel includes a phase element and an amplitude element. A first complex linear model of phase shift may be determined based at least in part on the determined vectors. Phase shift of at least one of the plurality of echo images may be corrected based on the first complex linear model.

In some embodiments, the identified homogeneous pixels belong to a homogeneous region.

In some embodiments, to identify homogeneous pixels in the plurality of echo images, the method may include one or more of the following operations. For each pixel of at least some pixels of an echo image of the plurality of echo images, an image gradient of the pixel may be obtained, and whether the pixel may be a homogeneous pixel may be determined based on the image gradient of the pixel and a threshold.

In some embodiments, to obtain the image gradient of the pixel, the method may include one or more of the following operations. A first image gray value of the pixel may be obtained. A second image gray value of a neighboring pixel of the pixel in a first direction, a third image gray value of a neighboring pixel of the pixel in a second direction, and a fourth image gray value of a neighboring pixel of the pixel in a third direction may be obtained. A first image gradient element of the pixel in the first direction may be determined based on a difference between the first image gray value and the second image gray value. A second image gradient element of the pixel in the second direction may be determined based on a difference between the first image gray value and the third image gray value. A third image gradient element of the pixel in the third direction may be determined based on a difference between the first image gray value and the fourth image gray value. The image gradient of the pixel may be determined based on the first image gradient element, the second image gradient element, and the third image gradient element.

In some embodiments, the plurality of echo images include a first pixel and a second pixel. In some embodiments, to identify the homogeneous pixels in the plurality of echo images, the method may include one or more of the following operations. A first image gradient of the first pixel may be obtained. A second image gradient of the second pixel may be obtained. Whether the first pixel and the second pixel are homogeneous pixels may be determined by comparing a difference between the first image gradient and the second image gradient with a threshold.

In some embodiments, the method may further include obtaining a linear model of phase shift. In some embodiments, to determine the first complex linear model based at least in part on the determined vectors, the method may include determining the first complex linear model based on the linear model of phase shift and the determined vectors.

In some embodiments, to determine the first complex linear model based on the linear model of phase shift and the determined vectors, the method may include one or more of the following operations. At least one parameter of the linear model of phase shift may be determined based on the determined vectors. The first complex linear model may be determined based on the linear model and the at least one parameter.

In some embodiments, to determine the first complex linear model based on the linear model of phase shift and the determined vectors, the method may include one or more of the following operations. The linear model of phase shift may be transformed to a second complex linear model. At least one parameter of the second complex linear model may be determined based on the determined vectors. The first complex linear model may be determined based on the second complex linear model and the at least one parameter.

In some embodiments, the at least one parameter of the second complex linear model comprises at least one first-order parameter. In some embodiments, to determine the at least one coefficient of the second complex linear model based on the determined vectors, the method may include one or more of the following operations. A plurality of complex numbers may be determined based on the second complex linear model and the determined vectors, each complex number corresponding to a homogeneous pixel. A phase corresponding to a sum of the plurality of complex numbers may be determined. The first-order coefficient of the second complex linear model may be determined based on the determined phase.

In some embodiments, the at least one parameter of the second complex linear model further comprises a zeroth-order coefficient. In some embodiments, the method may further include determining the zeroth-order coefficient of the second complex linear model based on the determined at least one first-order coefficient of the second complex linear model.

In some embodiments, the plurality of echo images correspond to a plurality of echo signals that are generated within one repetition time.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the present disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

The terminology used herein is for the purpose of describing particular exemplary embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," and/or "module" used herein are one method to distinguish different components, elements, parts, section or assembly of different level in ascending order. However, the terms may be displaced by another expression if they achieve the same purpose.

Figure 3:
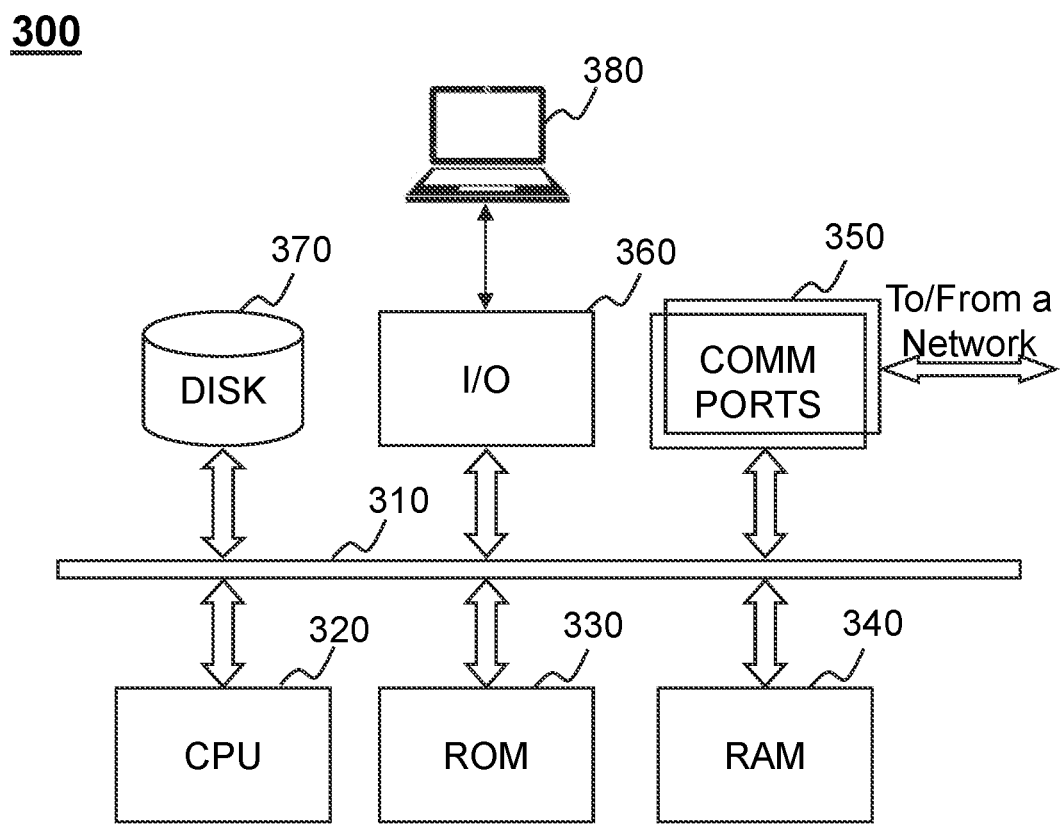
FIG. 3 is a schematic diagram illustrating exemplary hardware and/or software components of an exemplary computing device according to some embodiments of the present disclosure.

Generally, the word "module" or "unit" as used herein, refers to logic embodied in hardware or firmware, or to a collection of software instructions. A module or a unit described herein may be implemented as software and/or hardware and may be stored in any type of non-transitory computer-readable medium or another storage device. In some embodiments, a software module/unit may be compiled and linked into an executable program. It will be appreciated that software modules can be callable from other modules/units or from themselves, and/or may be invoked in response to detected events or interrupts. Software modules/units configured for execution on computing devices (e.g., processor 320 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units may be included in connected logic components, such as gates and flip-flops, and/or can be included of programmable units, such as programmable gate arrays or processors. The modules/units or computing device functionality described herein may be implemented as software modules/units, but may be represented in hardware or firmware. In general, the modules/units described herein refer to logical modules/units that may be combined with other modules/units or divided into sub-modules/sub-units despite their physical organization or storage. The description may be applicable to a system, an engine, or a portion thereof.

It will be understood that when a unit, engine or module is referred to as being "on," "connected to," or "coupled to," another unit, engine, or module, it may be directly on, connected or coupled to, or communicate with the other unit, engine, or module, or an intervening unit, engine, or module may be present, unless the context clearly indicates otherwise. As used herein, the term "and/or" includes any and all combinations of one or more of the associated listed items.

The term "image" used in this disclosure may refer to a 2D image, a 3D image, a 4D image, and/or any related image data. It should be noted that in this disclosure, the terms "image data" and "image" may be used interchangeably.

The term "pixel" used in this disclosure may refer to a physical point in an image (e.g., a 2D image, a 3D image, a 4D image). It should be noted that in this disclosure, the terms "pixel" and "voxel" may be used interchangeably.

The term "gray value" and "image gray value" of a certain pixel, may be used interchangeably to refer to a value indicating the gray level of the pixel.

A phase of an image and/or a phase of a pixel in the image, may be corrected with respect to the phase shift involved therein. It should be noted that in this disclosure, the terms "phase correcting" and "phase shift correcting" may be used interchangeably, and that the terms "phase correction" and "phase shift correction" may be used interchangeably.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of the present disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and methods for correcting phase shift in echo images using a phase correction device. In some embodiments, to correct phase shift, the phase correction device may determine a first complex linear model of phase shift by determining coefficients of a second complex linear model that expresses the phase shift of a certain pixel. The second complex linear model may account for errors introduced by a possible wrapping of the certain pixel or other pixels in an echo image. In some embodiments, the phase correction device may determine the coefficients using vectors of pixels in a homogeneous region. The vector of a pixel used herein may include a phase element (or phase for brevity) and an amplitude element (or amplitude for brevity). By including the phase information of pixels in addition to the amplitude information of the pixels, the phase correction device may determine the homogeneous region in a relatively simple manner, based on image gradients of the pixels in the echo images; additionally or alternatively, the errors introduced into the coefficients of the second complex linear model by the wrapped phases of pixels may be corrected, which may increase the accuracy of the second complex linear model.

Figure 1:
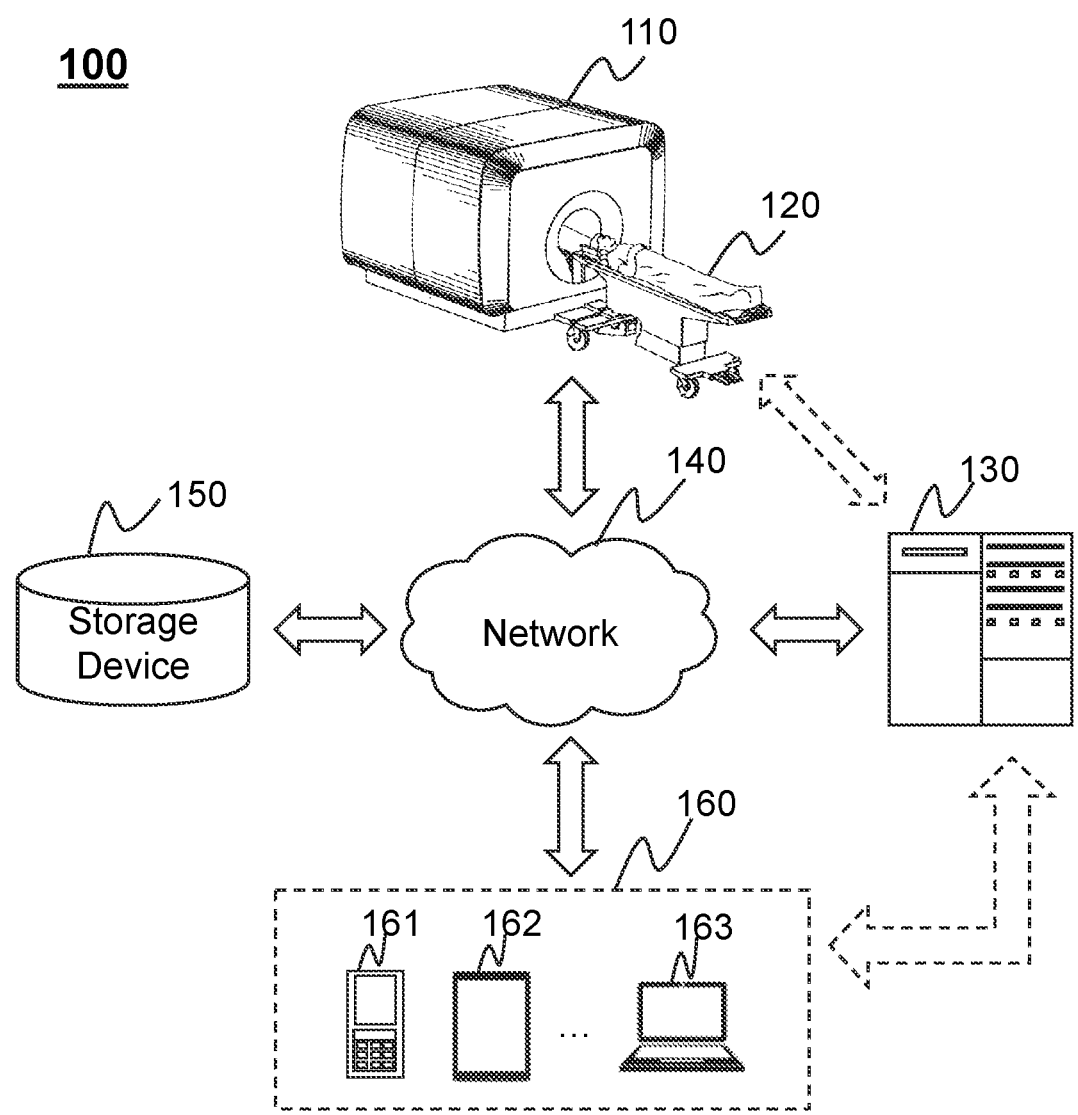
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system 100 according to some embodiments of the present disclosure. As shown in FIG. 1, MRI system 100 may include an MR scanner 110, an examining table 120, a processing device 130, a network 140, a storage device 150, and one or more terminal devices 160. In some embodiments, MR scanner 110, examining table 120, processing device 130, storage device 150, and/or terminal device 160 may be connected to and/or communicate with each other via a wireless connection (e.g., network 140), a wired connection, or any combination thereof.

MR scanner 110 may generate or provide image data (e.g., echo images) associated with MR signals via scanning a subject, or a part of the subject. In some embodiments, MR scanner 110 may include, for example, a magnet, one or more gradient coils, one or more radiofrequency (RF) coils, etc. In some embodiments, MR scanner 110 may be a permanent magnet MR scanner, a superconducting electromagnet MR scanner, or a resistive electromagnet MR scanner, or the like, or any combination thereof. In some embodiments, MR scanner 110 may be a high-field MR scanner, a mid-field MR scanner, a low-field MR scanner, or the like, or any combination thereof, according to the intensity of the magnetic field.

In some embodiments, the subject may include a body, a substance, an object, or the like, or any combination thereof. In some embodiments, the subject may include a specific portion of a body, a specific organ, or a specific tissue, such as head, brain, neck, body, shoulder, arm, thorax, cardiac, stomach, blood vessel, soft tissue, knee, feet, or the like, or any combination thereof. In some embodiments, MR scanner 110 may transmit the image data via network 140 to processing device 130, storage device 150, and/or terminal device 160. For example, the image data may be sent to processing device 130 for further processing, or may be stored in storage device 150.

Processing device 130 may process data and/or information obtained from MR scanner 110, storage device 150, and/or terminal device 160. In some embodiments, processing device 130 may process echo images obtained from MR scanner 110. In some embodiments, processing device 130 may correct phase shifts in at least one of the obtained echo images. In some embodiments, processing device 130 may be a single server or a server group. The server group may be centralized or distributed. In some embodiments, processing engine 130 may be local or remote. For example, processing engine 130 may access information and/or data from MR scanner 110, storage device 150, and/or terminal device 160 via network 140. As another example, processing engine 130 may be directly connected to MR scanner 110, terminal device 160, and/or storage device 150 to access information and/or data. In some embodiments, processing engine 130 may be implemented on a cloud platform. For example, the cloud platform may include a private cloud, a public cloud, a hybrid cloud, a community cloud, a distributed cloud, an inter-cloud, a multi-cloud, or the like, or any combination thereof. In some embodiments, processing engine 130 may be implemented by a computing device 300 having one or more components as described in connection with FIG. 3.

Network 140 may include any suitable network that can facilitate exchange of information and/or data for MRI system 100. In some embodiments, one or more components of MRI system 100 (e.g., MR scanner 110, examining table 120, processing engine 130, storage device 150, terminal device 160, etc.) may communicate information and/or data with one or more other components of MRI system 100 via network 140. For example, processing engine 130 may obtain image data from MR scanner 110 via network 140. As another example, processing engine 130 may obtain user instructions from terminal device 160 via network 140. Network 140 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, witches, server computers, or the like, or any combination thereof. For example, network 140 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, network 140 may include one or more network access points. For example, network 140 may include wired and/or wireless network access points such as base stations and/or internet exchange points through which one or more components of Mill system 100 may be connected to network 140 to exchange data and/or information.

Storage device 150 may store data, instructions, and/or any other information. In some embodiments, storage device 150 may store data obtained from processing engine 130 and/or terminal device 160. In some embodiments, storage device 150 may store data and/or instructions that processing engine 130 may execute or use to perform exemplary methods described in the present disclosure. In some embodiments, storage device 150 may include mass storage, a removable storage device, a volatile read-and-write memory, a read-only memory (ROM), or the like, or any combination thereof. Exemplary mass storage may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, storage device 150 may be implemented on a cloud platform as described elsewhere in the disclosure.

In some embodiments, storage device 150 may be connected to network 140 to communicate with one or more other components in Mill system 100 (e.g., processing engine 130, terminal device 160, etc.). One or more components in MRI system 100 may access the data or instructions stored in storage device 150 via network 140. In some embodiments, storage device 150 may be part of processing engine 130.

Terminal device 160 may be connected to and/or communicate with MR scanner 110, examining table 120, processing engine 130, and/or storage device 150. For example, processing engine 130 may acquire a scanning protocol from terminal device 160. As another example, terminal device 160 may obtain image data from MR scanner 110 and/or the databased 150. In some embodiments, terminal device 160 may include a mobile device 161, a tablet computer 162, a laptop computer 163, or the like, or any combination thereof. For example, the mobile device 140-1 may include a mobile phone, a personal digital assistant (PDA), a gaming device, a navigation device, a point of sale (POS) device, a laptop, a tablet computer, a desktop, or the like, or any combination thereof. In some embodiments, terminal device 160 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to processing engine 130 via, for example, a bus, for further processing. Other types of the input device may include a cursor control device, such as a mouse, a trackball, or cursor direction keys, etc. The output device may include a display, a speaker, a printer, or the like, or any combination thereof. In some embodiments, the terminal device 160 may be part of processing engine 130.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, storage device 150 may be a data storage including cloud computing platforms, such as, public cloud, private cloud, community, hybrid clouds, etc. In some embodiments, processing engine 130 may be integrated into MR scanner 110. However, those variations and modifications do not depart the scope of the present disclosure.

Figure 2:
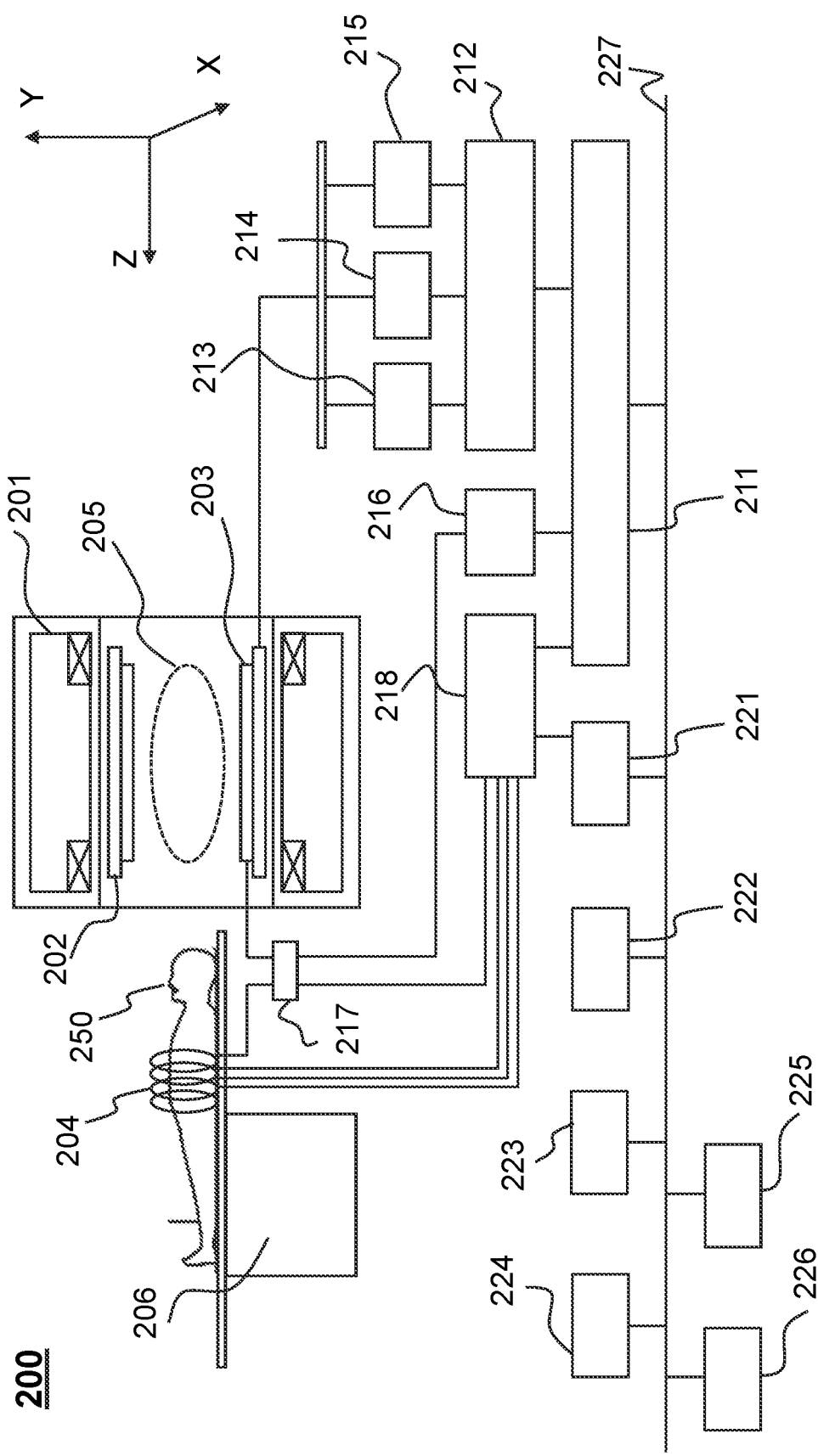
FIG. 2 is a schematic diagram illustrating an exemplary MIl system according to some embodiments of the present disclosure.

FIG. 2 is a schematic diagram illustrating an exemplary MRI system 200 according to some embodiments of the present disclosure. MRI system 200 may include a gantry. The gantry may include a magnet 201. In some embodiments, magnet 201 may generate a static magnetic field during an MRI process. In some embodiments, magnet 201 may be one of various types including a permanent magnet, a superconducting electromagnet, a resistive electromagnet, or the like, or any combination thereof. The superconducting electromagnet may include niobium, vanadium, technetium alloy, or the like, or any combination thereof. In some embodiments, magnet 201 may generate a magnetic field with a strength of 0.2 T, 0.5 T, 1.0 T, 1.5 T, 3.0 T, or the like, or any combination thereof. During an MRI process, an imaging object 250 may be supported by an examining table 206, and moved into a region 205 by moving examining table 206. In some embodiments, echo signals may be generated by the imaging object 250 during an MRI process, based on which echo images may be reconstructed. In some embodiments, an echo image may include a plurality of pixels, wherein each pixel may correspond to a spatial location in a coordinate system (e.g., the coordinate system illustrated in FIG. 2). As illustrated in FIG. 2, the coordinate system may include an X axis, a Y axis that is perpendicular to the X axis, and a Z axis that is perpendicular to the X axis and the Y axis. Specifically, the X axis and the Z axis may define a horizontal plane, the Y axis and the Z axis may define a vertical plane, and the Z axis may be along the axis of magnet 201.

In some embodiments, during an MRI process, a pulse control device 211 may control a radio frequency (RF) pulse generating device 216 to generate an RF pulse. The RF pulse may be transmitted to a body coil 203 and a local coil 204. Body coil 203 or a local coil 204 may apply the RF pulse to imaging object 250 to generate RF signals accordingly. In some embodiments, the generated RF signals may be processed by one or more amplifiers and a switch controller 217. In some embodiments, body coil 203 and/or local coil 204 may detect the processed RF signals, and transmit the processed RF signals to a radio frequency receiver 218. Radio frequency receiver 218 may relay the processed RF signals to an image reconstruction device 221, based on which image reconstruction device 221 may reconstruct an MR image.

In some embodiments, during an MRI process, gradients may be applied to MR signals to encode the MR signals. For example, MRI system 200 may include a gradient coil 202. Gradient coil 202 may be used to spatially encode the RF signal during an MRI process. Pulse control device 211 may control a gradient signal generation device 212 to generate gradient signals having gradient information in the X direction, the Y direction, and the Z direction. The gradient signals may be applied to region 205 to generate gradient magnetic fields in region 205. In some embodiments, before being applied to region 205, the gradient signals may be amplified by one or more gradient amplifiers (e.g., gradient amplifier 213, 214, and/or 215).

In some embodiments, during an MRI process, pulse control device 211, image reconstruction device 221, processing engine 222, display 223, I/O device 224, memory 225, and communication port 226 may exchange data and/or information through communication bus 227.

In some embodiments, processing engine 222 may be implemented on one or more processors. In some embodiments, display 223 may be a screen provided to a user for displaying an image. In some embodiments, I/O device 224 may be a keyboard, a mouse, a control box, or other related device that supports input/output of corresponding data streams. In some embodiments, memory 225 may be a read only memory (ROM), a random access memory (RAM), a hard disk, or the like, or any combination thereof. In some embodiments, memory 225 may be used to store data required by one or more other components in MRI system 200. In some embodiments, memory 225 may store instructions that processing engine 222 may executed or use by to perform exemplary methods described in the present disclosure. In some embodiments, communication port 226 may communicate data with other components outside MRI system 200 such as external devices, image capture devices, databases, external storage and image processing work stations, or the like, or any combination thereof.

FIG. 3 is a schematic diagram illustrating exemplary hardware and/or software components of an exemplary computing device on which processing engine 130 may be implemented according to some embodiments of the present disclosure. Processing engine 130 may be implemented on the computing device via its hardware, software program, firmware, or any combination thereof. Although only one such computing device is shown, for convenience, the functions of processing engine 130 described in the present disclosure may be implemented in a distributed fashion on a number of similar platforms, to distribute the processing load. Processing engine 130 may include, among other things, an internal communication bus 310, a processor 320 (or a CPU), a program storage and data storage of different forms (e.g., a disk 370, a read only memory (ROM) 330, or a random access memory (RAM) 340), for various data files to be processed and/or communicated by the computer, as well as possibly program instructions to be executed by processor 320. Aspects of the methods of the image processing and/or other processes, as outlined herein, may be embodied in programming. Program aspects of the technology may be thought of as "products" or "articles of manufacture" typically in the form of executable code and/or associated data that is carried on or embodied in a type of machine readable medium. Tangible non-transitory "storage" type media may include any or all of the memory or other storage for the computers, processors, or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another, for example, from a management server or host computer of a mammography system into the hardware platform(s) of a computing environment or other system implementing a computing environment or similar functionalities in connection with the image processing. Thus, another type of media that may bear the software elements includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

A computer-readable medium may take many forms including, for example, a tangible storage medium, a carrier wave medium, or physical transmission medium. Non-volatile storage media include, for example, optical or magnetic disks, such as any of the storage devices in any computer(s) or the like, which may be used to implement the system or any of its components as shown in the drawings. Volatile storage media may include dynamic memory, such as a main memory of such a computer platform. Tangible transmission media may include coaxial cables; copper wire and fiber optics, including the wires that form a bus within a computer system. Carrier-wave transmission media may take the form of electric or electromagnetic signal, or acoustic or light waves such as those generated during radio frequency (RF) and infrared (IR) data communications. Common forms of computer-readable media therefore may include for example: a floppy disk, a flexible disk, a hard disk, a magnetic tape, any other magnetic medium, a CD-ROM, a DVD or DVD-ROM, any other optical medium, punch cards paper tape, any other physical storage medium with patterns of holes, a RAM, a PROM or an EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a physical processor for execution.

Processor 320 may execute program instructions stored in a storage device (e.g., disk 370, ROM 330, RAM 340) to perform one or more functions of processing engine 130 described in the present disclosure. Processor 320 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a microcontroller unit, an advanced RISC machines processor (ARM), or the like, or a combinations thereof.

I/O 360 may input and/or output signals, data, information, etc. In some embodiments, I/O 360 may enable a user interaction with processing engine 130. In some embodiments, I/O 360 may include input/output device 380. In some embodiments, I/O 360 may communicate with input/output device 380. Examples of the input/output device may include a keyboard, a mouse, a touch screen, a microphone, a display device, a loudspeaker, a printer, a projector, or the like, or any combination thereof. Examples of the display device may include a liquid crystal display (LCD), a lightemitting diode (LED)-based display, a flat panel display, a curved screen, a television device, a cathode ray tube (CRT), a touch screen, or the like, or any combination thereof.

Communication port 350 may be connected to a network (e.g., network 140) to facilitate data communications. Communication port 350 may establish connections between MR scanner 110, examining table 120, processing engine 130, terminal device 160, and/or storage device 150. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, communication port 350 may be and/or include a standardized communication port, such as RS232, RS485, etc. In some embodiments, communication port 350 may be a specially designed communication port. For example, communication port 350 may be designed in accordance with the digital imaging and communications in medicine (DICOM) protocol.

Those skilled in the art will recognize that the present teachings are amenable to a variety of modifications and/or enhancements. For example, although the implementation of various components described herein may be embodied in a hardware device, it may also be implemented as a software only solution, for example, an installation on an existing server. In addition, processing engine 130 as disclosed herein may be implemented as a firmware, firmware/software combination, firmware/hardware combination, or a hardware/firmware/software combination.

Figure 4:
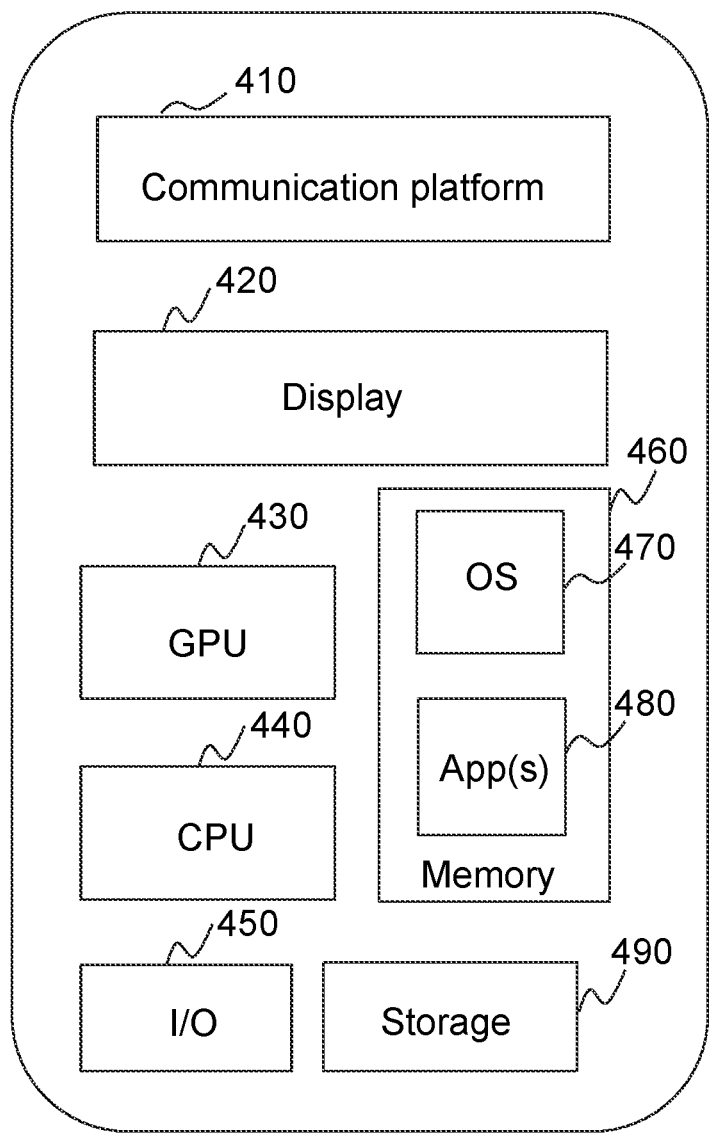
FIG. 4 is a schematic diagram illustrating exemplary hardware and/or software components of an exemplary mobile device according to some embodiments of the present disclosure.

FIG. 4 is a schematic diagram illustrating exemplary hardware and/or software components of an exemplary mobile device on which the terminal device 160 may be implemented according to some embodiments of the present disclosure. As illustrated in FIG. 4, mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in mobile device 400. In some embodiments, a mobile operating system 470 (e.g., iOS™, Android™, Windows Phone™, etc.) and one or more applications 480 may be loaded into memory 460 from storage 490 in order to be executed by CPU 440. Applications 480 may include a browser or any other suitable mobile apps for receiving and rendering information respect to data processing or other information from processing engine 130. User interactions with the information stream may be achieved via I/O 450 and provided to processing engine 130 and/or other components of MRI system 100 via network 140.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or external device. A computer may also act as a server if appropriately programmed.

Figure 5A:
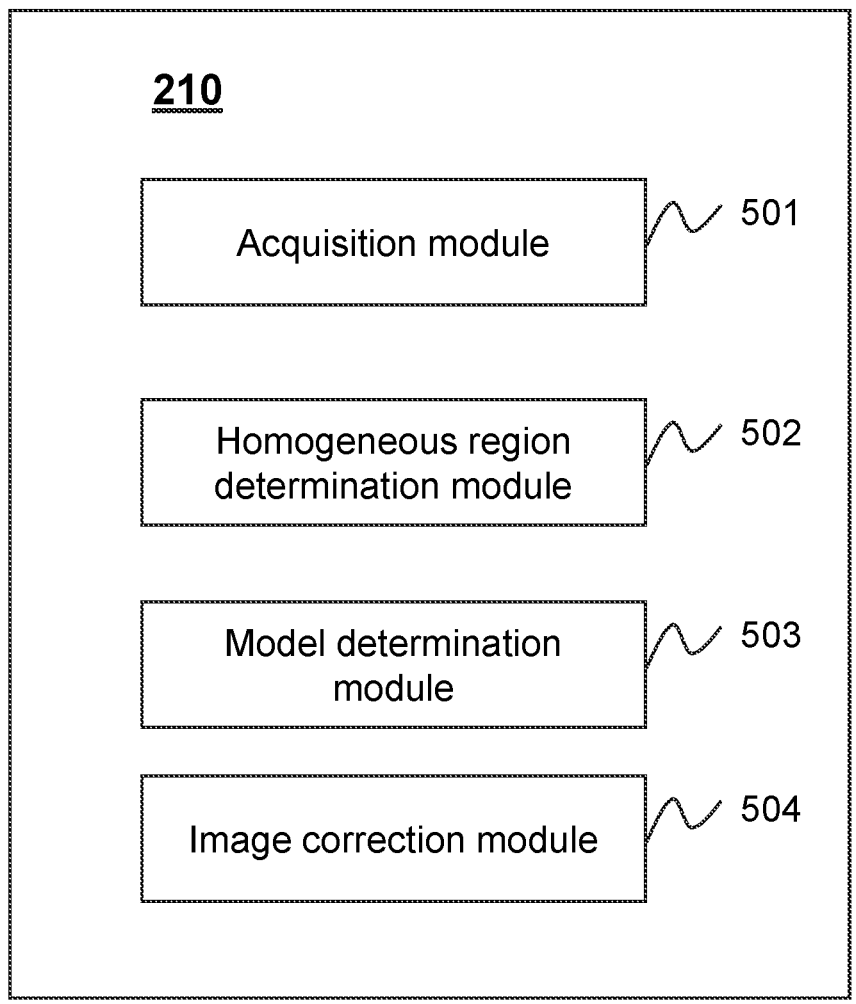
FIG. 5A is a block diagram illustrating an exemplary phase correction device according to some embodiments of the present disclosure.

FIG. 5A is a block diagram illustrating an exemplary phase correction device 210 according to some embodiments of the present disclosure. As illustrated in FIG. 5A, phase correction device 210 may include an acquisition module 501, a homogeneous region determination module 502, a model determination module 503, and an image correction module 504. Phase correction device 210 may be implemented on at least part of MRI system 100 or MRI system 200. For example, phase correction device 210 may be implemented on processing engine 130 and/or terminal device 160 in MRI system 100. As another example, phase correction device 210 may be implemented on processing engine 222.

Acquisition module 501 may acquire echo images. Merely by way of example, acquisition module 501 may acquire echo images from MRI scanner 110 in MRI system 100, or from image reconstruction device 221 in MRI system 200.

In some embodiments, acquisition module 501 may acquire echo images that correspond to echo signals generated within a repetition time (TR). The echo images may be expressed as ($1^{st}$ echo image, $2^{nd}$ echo image, $3^{rd}$ echo image, ..., $i^{th}$ echo image, ..., and $n^{th}$ echo image). Merely by way of example, the echo images may include six images expressed as ($1^{st}$ echo image, $2^{nd}$ echo image, $3^{rd}$ echo image, $4^{th}$ echo image, $5^{th}$ echo image, and $6^{th}$ echo image). The six echo images may correspond to six echo signals generated by an imaging object within one repetition time. One echo image may correspond to one echo signal.

In some embodiments, each of the echo images acquired by acquisition module 501 may include a plurality of pixels. Each pixel may have an image gradient and/or a vector. As used herein, a vector of a pixel may include the phase of the pixel and/or the amplitude of the pixel. As used herein, an image gradient refers to a directional change in the level of gray in the image. As used herein, an image gradient of a pixel in an image refers to the image gradient evaluated at the pixel. In some embodiments, some of the plurality of pixels may have phase shifts. In some embodiments, pixels in even echo images (the ith image of the echo images, i is an even number larger than 1) may have phase shifts. In some embodiments, for a certain pixel having a phase shift, there may be a relationship (e.g., a linear relationship) between the phase shift of the pixel and the spatial location of the pixel. In some embodiments, the relationship may be expressed as a linear model including one or more parameters (e.g., coefficients). The coefficients may include a plurality of (e.g., 3) first-order coefficients and a zeroth-order coefficient. See, e.g., Equation (6) and the description thereof.

In some embodiments, acquisition module 501 may transmit the echo images to homogeneous region determination module 502 and/or image correction module 504. For example, acquisition module 501 may transmit at least some of the echo images to homogeneous region determination module 502.

Homogeneous region determination module 502 may determine a homogeneous region in at least some of the echo images acquired by acquisition module 501. As used herein, one or more echo images acquired by acquisition module 501 in which homogeneous region determination module 502 identifies a homogeneous region may be collectively referred to as a first group. The remaining echo image(s) acquired by acquisition module 501 may be collectively referred to as a second group. In some embodiments, the homogeneous region, which is determined based on the echo images in the first group, may be further used to determine a linear model including 3 first-order coefficients and a zeroth-order coefficient. Thus, for the determination of the linear model, the first group may include three echo images.

The three echo images in the first group may be determined arbitrarily. In some embodiments, the three images in the first group may be consecutive or not. For example, for the acquired six echo images, the first group may include the $1^{st}$ echo image, the $2^{nd}$ echo image, and the $3^{rd}$ echo image, and the second group may include the $4^{th}$ echo image, the $5^{th}$ echo image, and the $6^{th}$ echo image. As another example, the first group may include the $1^{th}$ echo image, the $2^{nd}$ echo image, and the $4^{th}$ echo image, and the second group may include the $3^{rd}$ echo image, and the $5^{th}$ echo image, and the $6^{th}$ echo image. As another example, the first group may include the $1^{st}$ echo image, and the $3^{rd}$ echo image, and the $5^{th}$ echo image, and the second group may include the $2^{nd}$ echo image, $4^{th}$ echo image, and the $6^{th}$ echo image.

As used herein, a homogeneous region may refer to a region that is substantially homogeneous in gray distribution. Pixies in a homogeneous region may be referred to as homogeneous pixies. In some embodiments, the image gradient at any pixel in the region does not exceed a certain threshold. In some embodiments, a region may be regarded as substantially homogeneous in gray distribution when a difference between two image gradients of any two pixels in the region does not exceed a certain threshold. In some embodiments, the homogeneous region may correspond to a region in the imaging object that has similar constituents. For example, the homogeneous region may correspond to a lung of a patient being scanned, in which the constituents may be similar.

In some embodiments, homogeneous region determination module 502 may determine the homogeneous region based on image gradients of the pixels in the first plurality of echo images and a first threshold. In some embodiments, homogeneous region determination module 502 may determine the homogeneous region based on a difference between two image gradients of two pixels in the plurality of echo images and a second threshold.

Model determination module 503 may acquire a linear model and generate a complex linear model in complex domain (or referred to as a first complex linear model) according to the linear model based on information of pixels in a homogeneous region of the first plurality of echo images. Model determination module 503 may retrieve the linear model from one or more other components in the MRI system (e.g., network 140, storage device 150, terminal device 160, etc.) or from an external device. As illustrated in connection with acquisition module 501, a linear relationship between the phase shift of the pixel and the spatial location of the pixel may be expressed as the linear model including a plurality of coefficients. The coefficients may include a plurality of (e.g., 3) first-order coefficient and a zeroth-order coefficient. In some embodiments, model determination module 503 may determine the coefficients of the linear model to determine the first complex linear model. In some embodiments, model determination module 503 may determine the coefficients of the linear model based on vectors of at least some pixels in the homogeneous region of the first group, more description may be found in, for example, FIG. 10, FIG. 12, FIG. 13, and the descriptions thereof.

In some embodiments, model determination module 503 may transmit the first complex linear model to image correction module 504.

Image correction module 504 may correct an echo image received from one or more other components (e.g., acquisition module 501) in phase correction device 210. In some embodiments, image correction module 504 may correct at least one echo image of the first group and the second group.

In some embodiments, image correction module 504 may correct an even echo image in the first group and/or an even echo image in the second group. In some embodiments, to correct an echo image, for each of at least some pixels in the echo image, image correction module 504 may correct the pixel (e.g., the phase of the pixel) based on the first complex model. More description may be found in, e.g., FIG. 13 and the description thereof. In some embodiments, image correction module 504 may correct an echo image to obtain a corresponding corrected echo image, and generate an MR image to be displayed (e.g., on a terminal device 160) at least based on the corrected echo image.

In some embodiments, image correction module 504 may transmit the corrected echo image and/or the MR image to be displayed to one or more other components in or communicating with the MRI system. For example, image correction module 504 may transmit the MR image to be displayed to a terminal device 160, on which the MR image may be displayed.

It should be noted that the descriptions above in relation to phase correction device 210 is provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. For example, phase correction device 210 may further include a storage module to store data and/or information from one or more other components in phase correction device 210. As another example, acquisition module 501, rather than model determination module 503, may be configured to acquire the linear model. The acquisition model may further transmit the acquired linear model to model determination module 503. As a further example, acquisition module 501 may determine the image gradient of a pixel based on the image gray values of the pixel and neighboring pixels in certain directions. Acquisition module 501 may further transmit the determined image gradients to homogeneous region determination module 502.

Figure 5B:
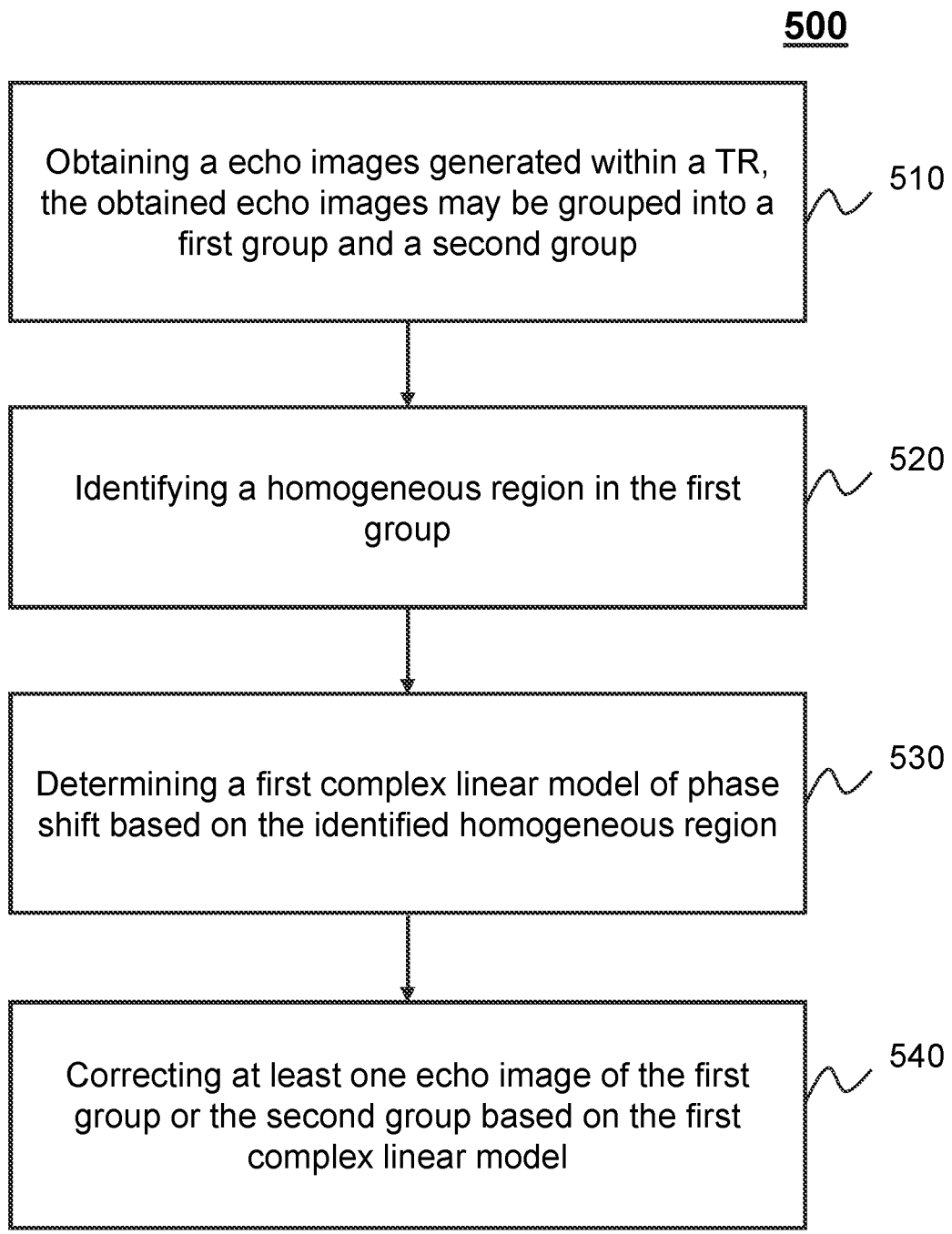
FIG. 5B is a flowchart illustrating an exemplary process for correcting phase according to some embodiments of the present disclosure.

FIG. 5B is a flowchart illustrating an exemplary process for correcting phase according to some embodiments of the present disclosure. At least a portion of process 500 may be implemented in MRI system 100 as illustrated in FIG. 1 or in MRI system 200 as illustrated in FIG. 2. In some embodiments, one or more operations in process 500 may be executed by phase correction device 210. In some embodiments, one or more operations in process 500 may implemented on the computing device 300 as illustrated in FIG. 3 or mobile device 400. In some embodiments, one or more operations in process 500 may be stored in storage device 150 and/or another storage device (e.g., ROM 330, RAM 340, etc.) in the form of instructions, and invoked and/or executed by, e.g., phase correction device 210, which, as illustrated above in FIG. 5A, may be implemented on processing engine 222 in MRI system 200, or at least one of processing engine 130 or terminal device 160.

In 510, echo images generated within a TR may be obtained. Process 510 may be executed by acquisition module 501. The obtained echo images may be grouped into the first group and the second group. The obtained echo images may be grouped arbitrarily and the first group may include three echo images. The three echo images may be consecutive or not. The obtained echo images may correspond to signals that are generated within a repetition time. Each echo image in the first group and/or the second group may include a plurality of pixels. Each pixel may be described using an image gradient and/or a vector (e.g., phase and/or amplitude). In some embodiments, some pixels may have phase shifts. In some embodiments, there may be a linear relationship between the phase shift of a certain pixel and the spatial location of the pixel.

In 520, a homogeneous region may be identified in the first group. Operation 520 may be executed by homogeneous region determination module 502. Homogeneous region determination module 502 may deem a pixel (e.g., a first pixel) of an echo image to belong to the homogeneous region upon a determination that the image gradient of the pixel is no larger than a first threshold value, and/or that a difference between the image gradient of the pixel and the image gradient of another pixel the phase of the pixel and the determined phase shift of the pixel. More description of the determination of the corrected phase of the pixel may be illustrated, e.g., FIG. 13 and the description thereof.

In 530, a first complex linear model of phase shift may be determined based on the identified homogeneous region. Operation 530 may be executed by model determination module 503. Detailed description of the determination of the first complex linear model of phase shift may be found in, e.g., FIG. 5C, FIG. 12 and the description thereof.

In 540, at least one echo image of the first plurality of echo images or the second plurality of echo images may be corrected based on the first complex linear model. Operation 540 may be executed by image correction module 504. Image correction module 504 may correct the at least one echo image based on the determined first complex linear model. For example, for each of at least some pixel in the at least one echo image, image correction module 504 may determine a phase shift of the pixel based on the first complex linear model of phase shift and the spatial location of the pixel. Further, image correction module 504 may determine a corrected phase of the pixel based on the phase of the pixel and the determined phase shift of the pixel. More description of the determination of the corrected phase of the pixel may be illustrated, e.g., FIG. 13 and the description thereof.

It should be noted that the above descriptions of process 500 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure. For example, an operation for obtaining the linear model may be added before operation 530 in which the first complex linear model of phase shift is determined. As another example, process 500 may further include an operation for generating an MR image to be displayed based at least in part on the corrected echo image, and an operation for transmitting the generated MR image to a device (e.g., terminal device 160) for display.

Figure 5C:
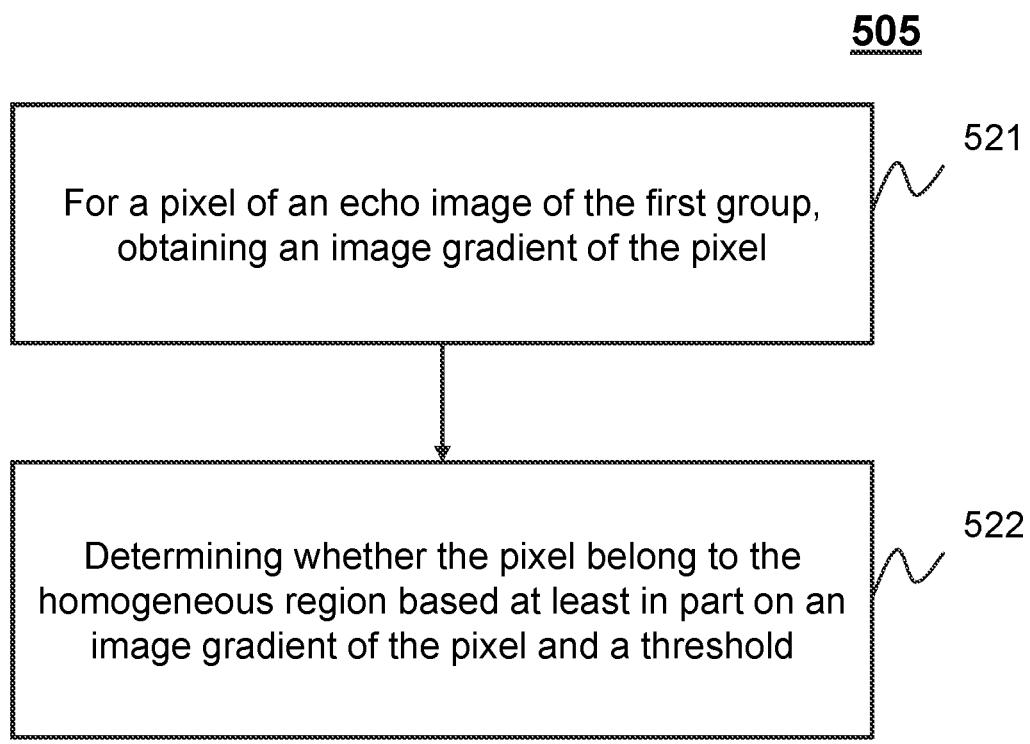
FIG. 5C is a flowchart illustrating an exemplary process for determining a homogeneous region according to some embodiments of the present disclosure.

FIG. 5C is a flowchart illustrating an exemplary process 505 for determining a homogeneous region according to some embodiments of the present disclosure. At least a portion of process 505 may be implemented in MRI system 100 as illustrated in FIG. 1 or in MRI system 200 as illustrated in FIG. 2. In some embodiments, one or more operations in process 505 may be executed by homogeneous region determination module 502. In some embodiments, one or more operations in process 505 may be implemented on the computing device 300 as illustrated in FIG. 3 or mobile device 400. In some embodiments, one or more operations in process 500 may be stored in storage device 150 and/or another storage device (e.g., ROM 330, RAM 340, etc.) in the form of instructions, and invoked and/or executed by, e.g., phase correction device 210, which, as illustrated above in FIG. 5A, may be implemented on processing engine 222 in MRI system 200, or at least one of processing engine 130 or terminal device 160. In some embodiments, part or all of process 505 may be performed to achieve operation 520 as described in connection with FIG. 5B.

In 521, for a pixel of an echo image of the first group, homogeneous region determination module 502 may obtain an image gradient of the pixel. In some embodiments, homogeneous region determination module 502 may determine an image gradient of a pixel based on the image gray value of the pixel, and image gray values of its neighboring pixels in the same echo image. For instance, an image gradient of a pixel along one direction (e.g., the X direction, the Y direction, the Z direction) may be determined based on the image gray value of the pixel and the image gray value of a neighboring pixel that is right next to the pixel in that direction. More description of the determination of the image gradient of a pixel may be found in, e.g., FIG. 7 and the description thereof.

In 522, homogeneous region determination module 502 may determine a homogeneous region by identifying pixels belonging to the homogeneous region based at least in part on image gradients of pixels and a threshold. In some embodiments, homogeneous region determination module 502 may determine whether a pixel belongs to the homogeneous region by comparing the image gradient of the pixel with a first threshold. In some embodiments, homogeneous region determination module 502 may determine whether a pixel belongs to the homogeneous region by comparing a difference between the image gradient of the pixel and that of another pixel in any one of the first group, with a second threshold. More description of the determination of the homogeneous region may be found in, for example, FIG. 8 and FIG. 9, and the descriptions thereof.

It should be noted that the above descriptions of process 505 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure. For example, for a pixel of an echo image of the first group, homogeneous region determination module 502 may obtain an image gray value of the pixel rather than the image gradient of the pixel. Process 505 may further include an operation for determining the image gradient of the pixel by homogeneous region determination module 502 based on the image gray value of the pixel of an echo image and the image gray values of neighboring pixels of the same echo image that are next to the pixel in certain directions. As used herein, neighboring pixels in a specific direction refer to pixels that are next to each other in the direction and not spaced apart by any other pixels. More description of the determination of the image gradient of a pixel may be found in, e.g., FIG. 7 and the description thereof.

Figure 5D:
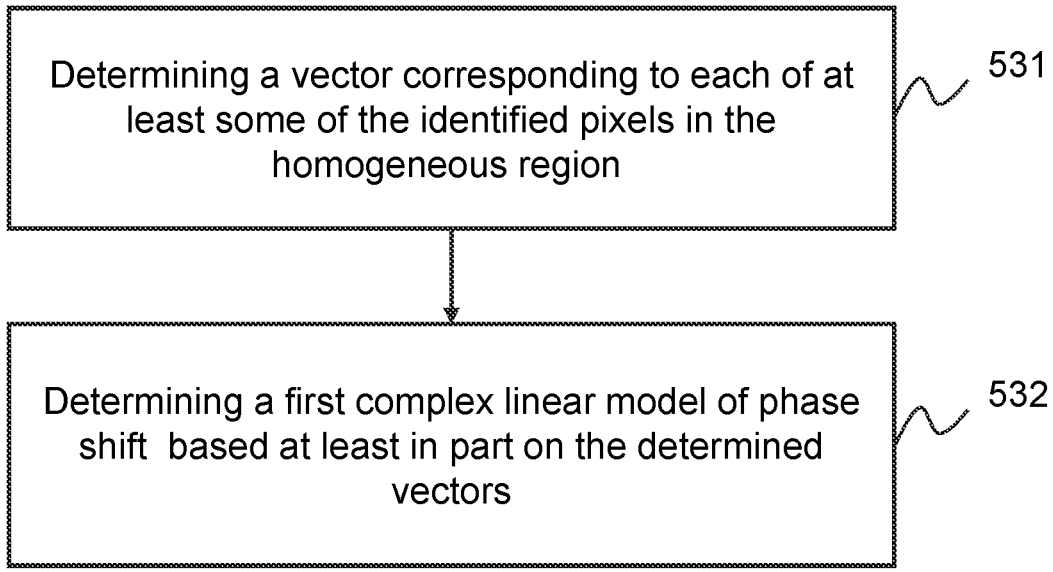
FIG. 5D is a flowchart illustrating an exemplary process for determining a first complex linear model of phase shift according to some embodiments of the present disclosure.

FIG. 5D is a flowchart illustrating an exemplary process 515 for determining a first complex linear model of phase shift according to some embodiments of the present disclosure. At least a portion of process 515 may be implemented in MRI system 100 as illustrated in FIG. 1 or in MRI system 200 as illustrated in FIG. 2. In some embodiments, one or more operations in process 515 may be executed by model determination module 503. In some embodiments, one or more operations in process 515 may be implemented on the computing device 300 as illustrated in FIG. 3 or mobile device 400. In some embodiments, one or more operations in process 500 may be stored in storage device 150 and/or another storage device (e.g., ROM 330, RAM 340, etc.) in the form of instructions, and invoked and/or executed by, e.g., phase correction device 210, which, as illustrated above in FIG. 5A, may be implemented on processing engine 222 in MRI system 200, or at least one of processing engine 130 or terminal device 160. In some embodiments, part or all of process 505 may be performed to achieve operation 530 as described in connection with FIG. 5B.

In 531, model determination module 503 may obtain a vector corresponding to each of at least some of the identified pixels in the homogeneous region. A vector of a pixel may include the phase and/or the amplitude of the pixel.

In 532, model determination module 503 may determine a first complex linear model of phase shift based at least in part on the determined vectors. Model determination module 503 may determine the first complex linear model of phase shift by determining a plurality of coefficients of a linear model based on vectors of at least some pixels in the homogeneous region. The linear model may express the relationship between the phase shift of a certain pixel and the spatial location of the certain pixel. More description of the determination of a plurality of coefficients of a linear model may be found in, e.g., FIG. 12 and the description thereof.

It should be noted that the above descriptions of process 505 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure. For example, an operation for obtaining a first linear model may be added before operation 532.

Figure 6A:
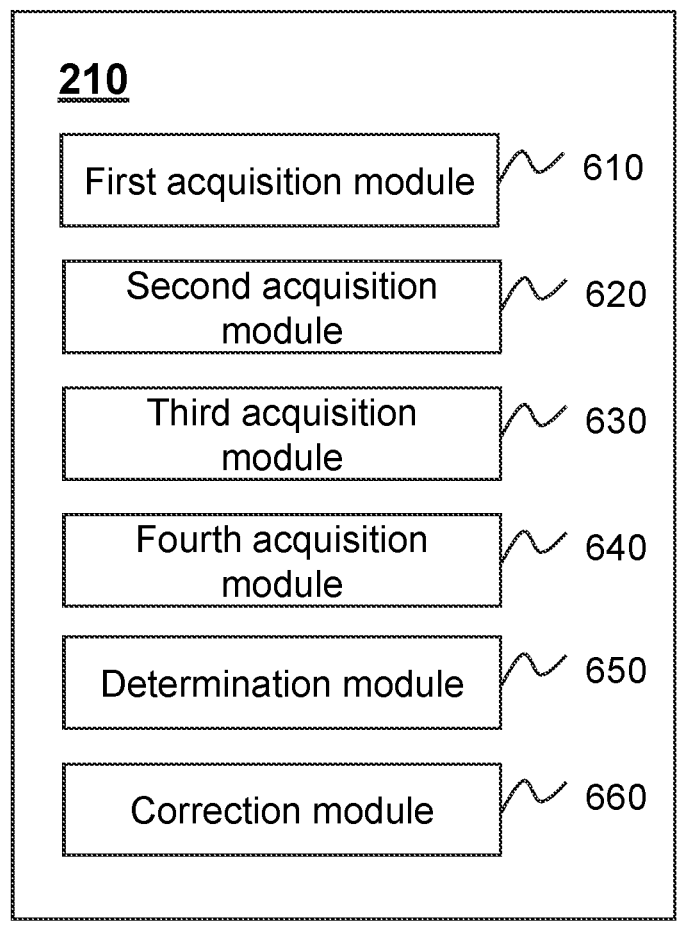
FIG. 6A is a block diagram illustrating an exemplary phase correction device according to some embodiments of the present disclosure.

FIG. 6A is a block diagram illustrating an exemplary phase correction device 210 according to some embodiments of the present disclosure. Phase correction device 210 may include a first acquisition module 610, a second acquisition module 620, a third acquisition module 630, a fourth acquisition module 640, a determination module 650, and a correction module 660. In some embodiments, first acquisition module 610 and second acquisition module 620 may be configured to perform functions of homogeneous region determination module 502. Third acquisition module 630 may be configured to perform functions of homogeneous region determination module 502. Fourth acquisition module 640 and determination module 650 may be configured to perform functions of model determination module 503. Correction module 660 may be configured to perform functions of image correction module 502. Phase correction device 210 may be implemented on at least part of MRI system 100 or MRI system 200. For example, phase correction device 210 may be implemented on processing engine 130 and/or terminal device 160 in MRI system 100. As another example, phase correction device 210 may be implemented on processing engine 222.

First acquisition module 610 may be configured to obtain a plurality of echo images.

Second acquisition module 620 may be configured to, for each echo image of at least some of the plurality of the obtained echo image, obtain an image gradient of each pixel of at least some pixels of the echo image. In some embodiments, second acquisition module 620 may directly receive image gradients of pixels from one or more other components (e.g., the acquisition module 501, the first acquisition module 610, etc.) in the MRI system 100 or 200. In some embodiments, second acquisition module 620 may be configured to, for each echo image of at least some of the plurality of the obtained echo image, obtain an image gray value of each pixel of at least some pixels of the echo image, and determine the image gradient of the pixel based on the image gray value of the pixel and image gray values of pixels that are next to the pixel in certain directions, respectively.

Third acquisition module 630 may be configured to determine a homogeneous region in at least some of the plurality of echo images based on the image gradients.

Fourth acquisition module 640 may be configured to, for each of at least some of the pixels in the homogeneous region, obtain the phase and the amplitude of the pixel.

Determination module 650 may be configured to determine a first linear model of phase shift in complex domain. As used herein, a first linear model of phase shift in the complex domain may be referred to as a first complex linear model of phase shift for brevity. Determination module 650 may determine the first complex linear model of phase shift by determining coefficients of the linear model of phase shift (or simply referred to as the linear model) based on the determined phases and amplitudes of pixels of the homogeneous region. In some embodiments, determination module 650 may receive the linear model of phase shift from other components in MRI system 200 or 100, and/or retrieve the linear model of phase shift stored in other components in MRI system 200 or 100 (e.g., storage device 150).

Correction module 660 may be configured to correct the phase of at least one echo image of the plurality of echo images based on the first complex linear model of phase shift.

It should be noted that the descriptions above in relation to phase correction device 210 are provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. For example, phase correction device 210 may further include a storage module (not shown in FIG. 6). The storage module may be configured to store data received from one or more other components in phase correction device 210 (e.g., first acquisition module 610, second acquisition module 620, etc.). Similar modifications fall within the scope of the present disclosure.

Figure 6B:
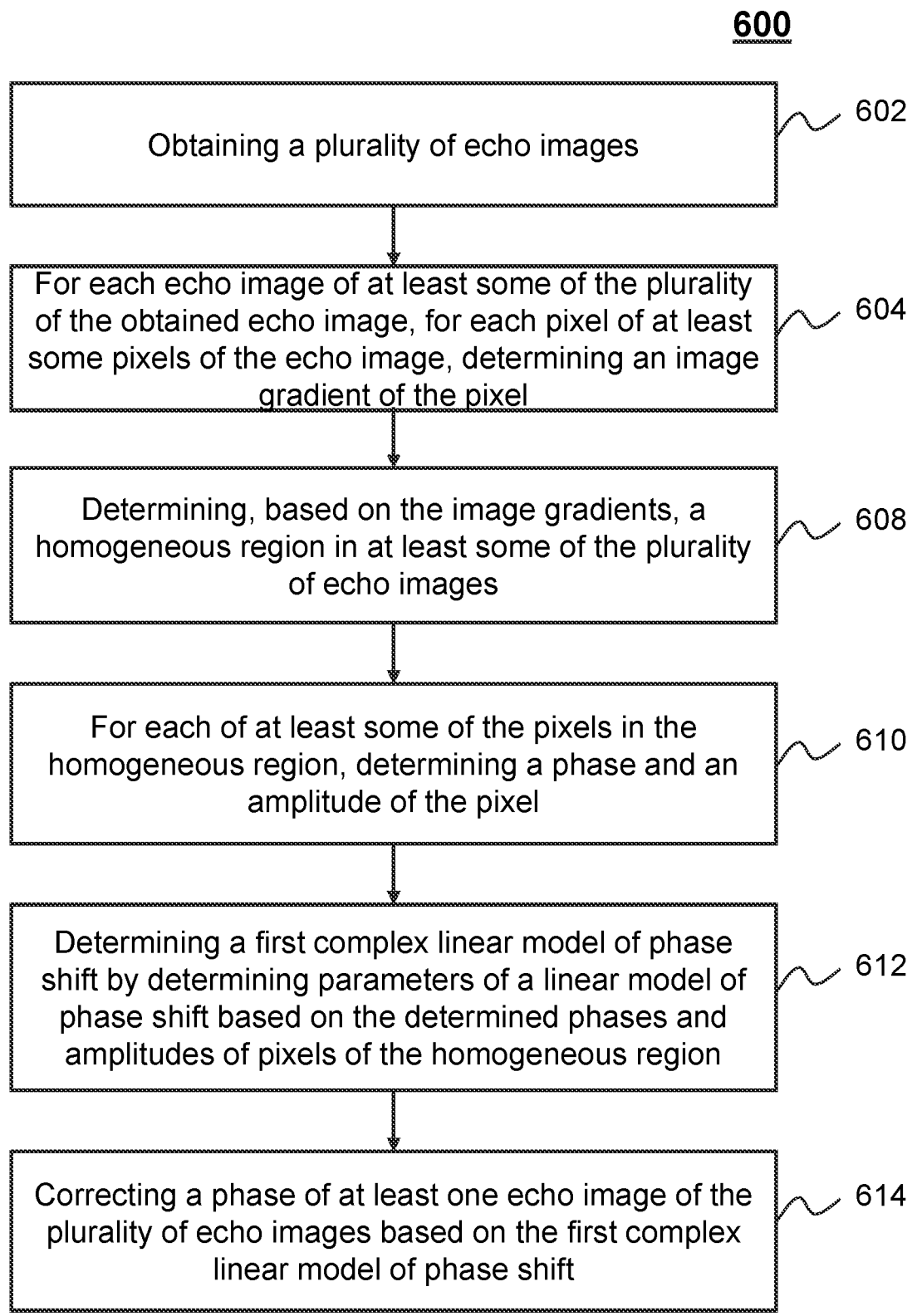
FIG. 6B is a flowchart illustrating an exemplary process for correcting phase according to some embodiments of the present disclosure.

FIG. 6B is a flowchart illustrating an exemplary process for correcting phase according to some embodiments of the present disclosure. At least a portion of process 600 may be implemented in MRI system 100 as illustrated in FIG. 1 or in MRI system 200 as illustrated in FIG. 2. In some embodiments, one or more operations in process 600 may be executed by phase correction device 210. In some embodiments, one or more operations in process 600 may be implemented on the computing device 300 as illustrated in FIG. 3 or mobile device 400. In some embodiments, one or more operations in process 600 may be stored in storage device 150 and/or another storage device (e.g., ROM 330, RAM 340, etc.) in the form of instructions, and invoked and/or executed by, e.g., phase correction device 210.

In 602, first acquisition module 610 may obtain echo images. RF coils in MRI system 200 or 100 may apply an RF excitation sequence (or referred to as an MR sequence) to an imaging object to acquire echo signals associated with the imaging object. In some embodiments, in response to the application of an RF excitation sequence to an imaging object within a repetition time (or simply referred as a TR), the imaging object may send out a plurality of (e.g., 6, 8, 9, 12, etc.) echo signals. The plurality of echo signals may be detected by MIll system 200 or 100 at a plurality of echo times (or referred to as TE).

In 604, for each echo image of at least some of the obtained plurality of the echo images, for each pixel of at least some pixels of the echo image, second acquisition module 620 may obtain an image gradient of the pixel. An echo image may include a plurality of pixels. The plurality of pixels may be in one or more homogeneous regions. In some embodiments, the image gradient of an image at a certain pixel may indicate a change in the gray value between neighboring pixels and the pixel. A larger change in the gray value of a pixel with respect to the gray values of its neighboring pixels may indicate a larger image gradient of the image at the pixel, and a higher possibility that the pixel is on a boundary between two different homogeneous regions or between a homogeneous region and an inhomogeneous region.

In 608, third acquisition module 630 may determine a homogeneous region in at least some of the plurality of echo images based on the image gradients. In some embodiments, a homogeneous region may correspond to a region in an imaging subject (e.g., a patient) with similar substances throughout the region. For example, for a patient, a homogeneous region may correspond to a tissue of the patient. As described in connection with operation 604, the image gradient of a certain pixel in a direction may indicate a change of the gray value of the pixel with respect to a neighboring pixel right next to the pixel in the direction. Given that the density of hydrogen atoms in a homogeneous region (e.g., within same tissue of an imaging subject) may be substantially uniform or homogeneous, which may result in pixels with substantially homogeneous image gray values, third acquisition module 630 may determine a homogeneous region in at least some of the plurality of echo images based on the obtained image gradients.

In some embodiments, third acquisition module 630 may determine a candidate homogenous region in each of the at least some of the plurality of echo images, respectively, and determine a target homogeneous region that corresponds to the at least some of the plurality of echo images based on the determined candidate homogeneous regions. The determined candidate homogeneous regions in the echo images may correspond to a same part (e.g., tissue) of an imaging object. For example, the at least some of the plurality of echo images may include a first echo image and a second echo image. Third acquisition module 630 may determine a first candidate homogenous region in the first image, and a second candidate homogeneous region in the second image, respectively, and further determine a target homogeneous region corresponding to the first echo image and the second echo image based on the first candidate homogenous region and the second candidate homogenous region. In some embodiments, third acquisition module 630 may designate an overlapping region among candidate homogeneous regions to be a target homogeneous region.

In 610, for each of at least some of the pixels in the target homogeneous region, fourth acquisition module 640 may obtain the phase and the amplitude of the pixel.

In 612, determination module 650 may determine a first complex linear model of phase shift. In some embodiments, determination module 650 may determine the first complex linear model of phase shift by determining parameters of a linear model of phase shift based on the determined phases and amplitudes of pixels of the homogeneous region.

In 614, correction module 660 may correct the phase of at least one echo image of the plurality of echo images based on the first complex linear model of phase shift.

According to process 600 illustrated above, in one aspect, a homogeneous region from a plurality of echo images may be obtained based on the image gradients of pixels in a plurality of echo images. As compared to prior art in which a homogeneous region in an echo image may be determined based on information provided by a third party database and an organ segmentation process, process 600 may identify a homogeneous region in a relatively simple manner. In another aspect, to determine a first complex linear model of phase shift, parameters of a linear model may be determined based on vectors of at least some pixels of the homogeneous region (i.e., phases and amplitudes of the pixels), and each vector may be expressed in the complex format. According to prior art, some of the phases of the pixels expressed in the real domain may be wrapped in the determination of parameters of a linear model of phase shift, introducing errors into the linear model. As compared to prior art, process 600 may determine parameters of a complex linear model of phase shift in a more accurate manner by using complex vectors of homogeneous pixels in determining parameters of the complex linear model of phase shift. In some embodiments, to reduce or remove the errors in the linear model of phase shift caused by phase wrapping of pixels in the determination of parameters of the linear model, phases unwrapping need to be performed in such pixels, which may increase the computational burden and processing time. As compared to prior art, process 600 may determine parameters of a complex linear model of phase shift in a more efficient manner by using complex vectors of homogeneous pixels in determining parameters of the complex linear model of phase shift.

It should be noted that the above descriptions of process 600 are provided for the purposes of illustration, and not intended to limit the scope of the present disclosure. For persons having ordinary skills in the art, various modifications and changes in the forms and details of the application of the above method and system may occur without departing from the principles in the present disclosure. For example, process 600 may further include an operation for generating an MR image to be displayed based at least in part on the corrected echo image that is generated in operation 614. However, those variations and modifications also fall within the scope of the present disclosure.

Figure 7:
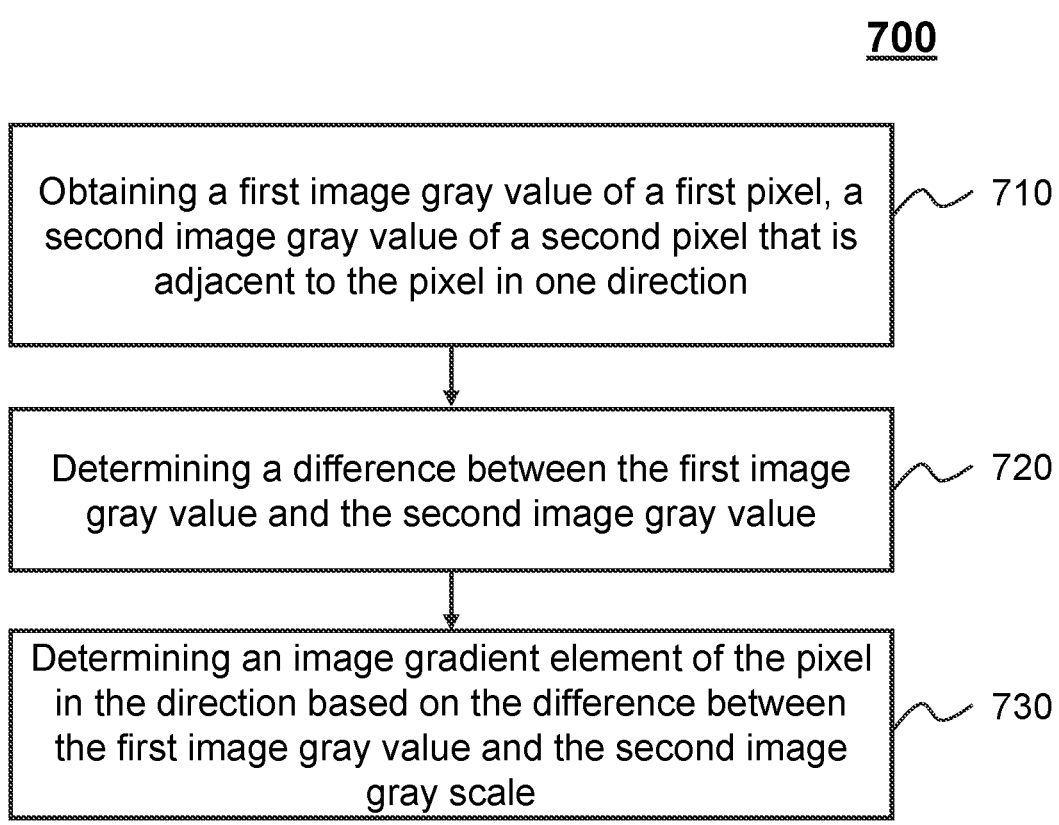
FIG. 7 is a flowchart illustrating an exemplary process for determining an image gradient element of a pixel according to some embodiments of the present disclosure.

FIG. 7 is a flowchart illustrating an exemplary process 700 for determining an image gradient element of a pixel according to some embodiments of the present disclosure. At least a portion of process 700 may be implemented in MRI system 100 as illustrated in FIG. 1 or in MRI system 200 as illustrated in FIG. 2. In some embodiments, one or more operations in process 700 may be executed by second acquisition module 620 in phase correction device 210. In some embodiments, one or more operations in process 700 may be implemented on the computing device 300 as illustrated in FIG. 3 or mobile device 400. In some embodiments, one or more operations in process 700 may be stored in storage device 150 and/or another storage device (e.g., ROM 330, RAM 340, etc.) in the form of instructions, and invoked and/or executed by, e.g., phase correction device 210. In some embodiments, part or all of process 700 may be performed to achieve operation 608 as described in connection with FIG. 6.

In 710, second acquisition module 620 may obtain a first image gray value of a first pixel and a second image gray value of a second pixel. The second pixel may be next to the first pixel in a certain direction (e.g., a first direction, the X direction, the Y direction, the Z direction).

In 720, second acquisition module 620 may determine a difference between the first image gray value and the second image gray value.

In 730, second acquisition module 620 may determine an image gradient element of the pixel in the direction (or referred to as a first image gradient element) based on the difference between the first image gray value and the second image gray value. Merely by way of example, the second acquisition module 620 may designate the difference between the first image gray value and the second image gray value as the first image gradient of the pixel.

In some embodiments, process 700 may further include one or more of the following operations to determine the image gradient of a certain pixel. The one or more operations may be executed by second acquisition module 620. Second acquisition module 620 may further obtain a third image gray value of a pixel that is next to the pixel in a second direction, determine a difference between the first image gray value and the third image gray value, and further determine a second image gradient element based on the determined difference between the first image gray value and the third image gray value. Second acquisition module 620 may further obtain a fourth image gray value of a pixel that is next to the pixel in a third direction, determine a difference between the first image gray value and the fourth image gray value, and further determine a third image gradient element based on the determined difference between the first image gray value and the fourth image gray value. In some embodiments, the first direction, the second direction, and the third direction may be parallel to the axes of a coordinate system. For example, the first direction, the second direction, and the third direction may be parallel to the axes of a Cartesian coordinate system illustrated in FIG. 2 including the X direction, the Y direction, and the Z direction, respectively.

In some embodiments, second acquisition module 620 may further determine an image gradient of the first pixel based on the first image gradient element, the second image gradient element, and the third image gradient element. In some embodiments, second acquisition module 620 may determine an image gradient by:

$$\text{Grad}(x, y, z) = \sqrt{G_x^2 + G_y^2 + G_z^2}, \quad (1)$$

where Grad (x, y, z) refers to the image gradient of a specific pixel, (x, y, z) refers to a coordinate of the specific pixel, $G_x$ refers to the difference between the first image gray value of the specific pixel and the second image gray value of the pixel that is next to the specific pixel in the X direction (or a first image gradient element), $G_y$ refers to the difference between the first image gray value of the specific pixel and a third image gray value of the pixel that is next to the specific pixel in the Y direction (or a second image gradient element), and $G_z$ refers to the difference between the first image gray value of the specific pixel and the fourth image gray value of the pixel that is next to the specific pixel in the Z direction (or a third image gradient element).

Figure 8:
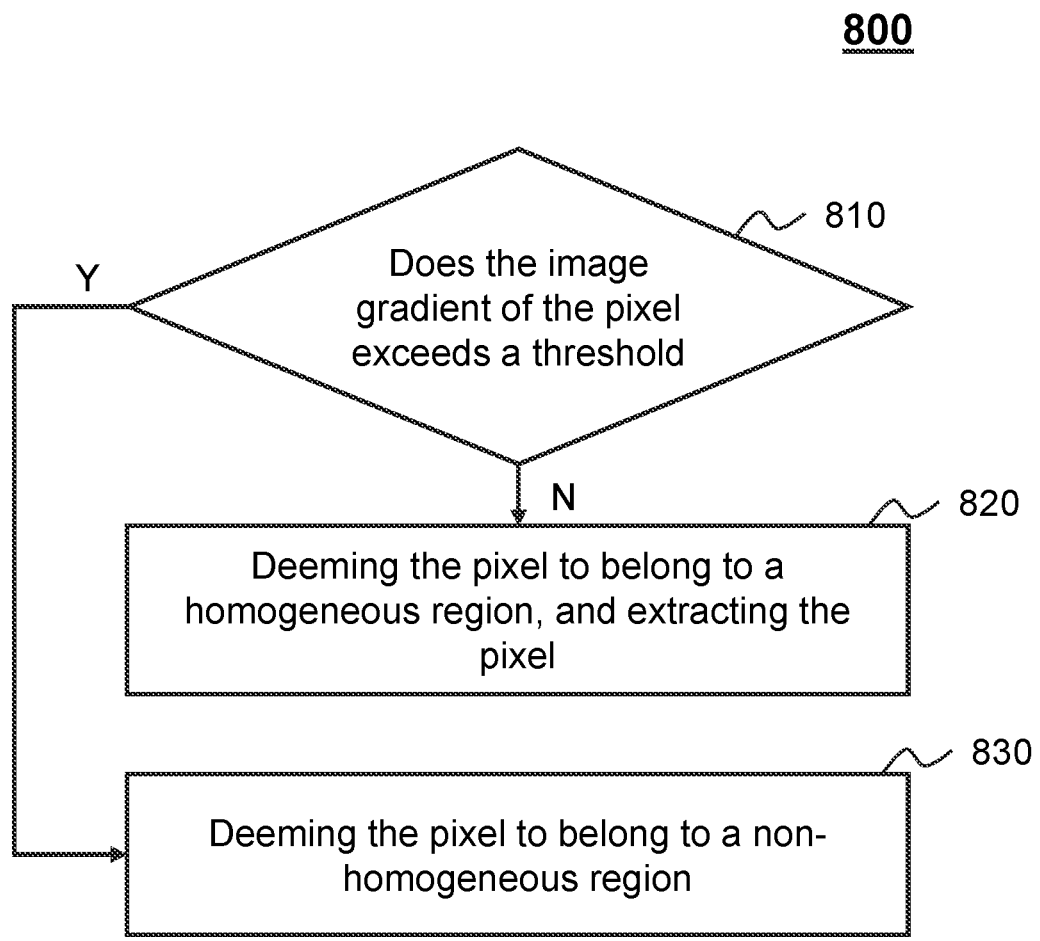
FIG. 8 is a flowchart illustrating an exemplary process for determining a homogeneous region from a plurality of echo images according to some embodiments of the present disclosure.

FIG. 8 is a flowchart illustrating an exemplary process 800 for determining a homogeneous region from a plurality of echo images according to some embodiments of the present disclosure. At least a portion of process 800 may be implemented in MRI system 100 as illustrated in FIG. 1 or in MRI system 200 as illustrated in FIG. 2. In some embodiments, one or more operations in process 800 may be executed by third acquisition module 630 in phase correction device 210. In some embodiments, one or more operations in process 800 may be implemented on the computing device 300 as illustrated in FIG. 3 or mobile device 400. In some embodiments, one or more operations in process 700 may be stored in storage device 150 and/or another storage device (e.g., ROM 330, RAM 340, etc.) in the form of instructions, and invoked and/or executed by, e.g., phase correction device 210. In some embodiments, part or all of process 800 may be performed to achieve operation 608 as described in connection with FIG. 6.

In 810, third acquisition module 630 may determine whether an image gradient of a pixel exceeds a threshold. The image gradient of the pixel may be determined by process 700 in FIG. 7.

Upon a determination that the image gradient of the pixel does not exceed the threshold, third acquisition module 630 may execute operation 820. In 820, third acquisition module 630 may deem the pixel to belong to a homogeneous region and extract the pixel.

Upon a determination that the image gradient of the pixel exceeds the threshold, third acquisition module 630 may execute operation 830. In 830, third acquisition module 630 may deem the pixel to belong to a non-homogeneous region. As used herein, a non-homogeneous region may be defined relative to a homogeneous region, and is not intended to define inherent properties of the pixel. In some embodiments, a pixel belonging to a non-homogeneous region that is defined relative to a certain homogeneous region (e.g., a first homogeneous region) in a plurality of echo images may belong to another homogeneous region (e.g., a second homogeneous region) in the plurality of echo images. In some embodiments, the pixels that are not extracted and/or the pixels deemed to be within the non-homogeneous region may be set as background during processing of pixels in the homogeneous region to reduce the processing time.

In some embodiments, for each of at least some pixels of the plurality of echo images, third acquisition module 630 may determine whether the pixel belongs to a homogeneous region, and further extract pixels that belong to a homogeneous region to define the homogeneous region.

It should be noted that the above descriptions of process 800 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure. For example, operation 830 may be omitted. Instead, upon a determination that the image gradient of the pixel exceeds the threshold, third acquisition module 630 may remove the pixel from further processing, and/or process a next pixel in the plurality of echo images.

Figure 9:
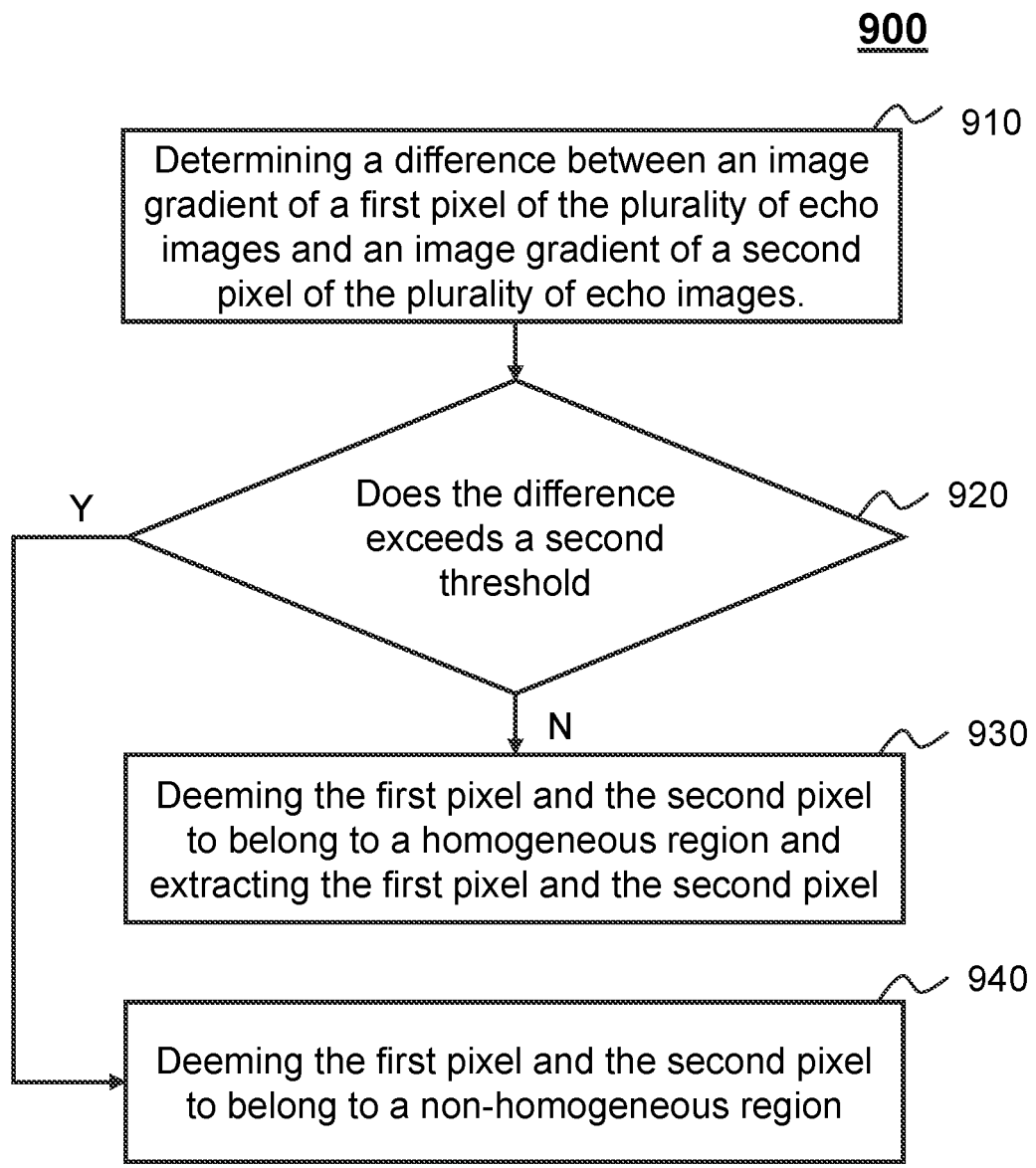
FIG. 9 is a flowchart illustrating another exemplary process for determining a homogeneous region from a plurality of echo images according to some embodiments of the present disclosure

FIG. 9 is a flowchart illustrating another exemplary process for determining a homogeneous region from a plurality of echo images according to some embodiments of the present disclosure. At least a portion of process 900 may be implemented in Mill system 100 as illustrated in FIG. 1 or in Mill system 200 as illustrated in FIG. 2. In some embodiments, one or more operations in process 900 may be executed by third acquisition module 630 in phase correction device 210. In some embodiments, one or more operations in process 900 may be implemented on the computing device 300 as illustrated in FIG. 3 or mobile device 400. In some embodiments, one or more operations in process 900 may be stored in storage device 150 and/or another storage (e.g., ROM 330, RAM 340, etc.) in the form of instructions, and invoked and/or executed by, e.g., phase correction device 210. In some embodiments, part or all of process 900 may be performed to achieve operation 608 as described in connection with FIG. 6.

In 910, third acquisition module 630 may determine a difference between an image gradient of a first pixel of the plurality of echo images and an image gradient of a second pixel of any one echo image of the plurality of echo images. The first pixel and the second pixel may be any two pixels in the plurality of echo images. In some embodiments, the first pixel and the second pixel may be in a same echo image or in different echo images. In some embodiments, the image gradient of the first pixel or the image gradient of the second pixel may be determined by process 700 in FIG. 7.

In 920, third acquisition module 630 may determine whether the difference exceeds a threshold.

Upon a determination that the difference does not exceed the threshold, third acquisition module 630 may execute operation 930. In 930, third acquisition module 630 may deem the first pixel and/or the second pixel to belong to a homogeneous region and/or extract the first pixel and the second pixel as homogeneous pixels.

Upon a determination that the difference exceeds the threshold, third acquisition module 630 may execute operation 940. In 940, third acquisition module 630 may deem the first pixel and/or the second pixel to belong to a non-homogeneous region.

In some embodiments, for any two pixels of the plurality of echo images, third acquisition module 630 may determine whether the two pixels are homogeneous pixels and/or belong to a homogeneous region, and further extract pixels that belong to the homogeneous region to obtain the homogeneous region.

It should be noted that the above descriptions of process 900 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure. For example, operation 940 may be omitted. Instead, upon a determination that difference exceeds the threshold, third acquisition module 630 may remove the two pixels from further processing.

Figure 10:
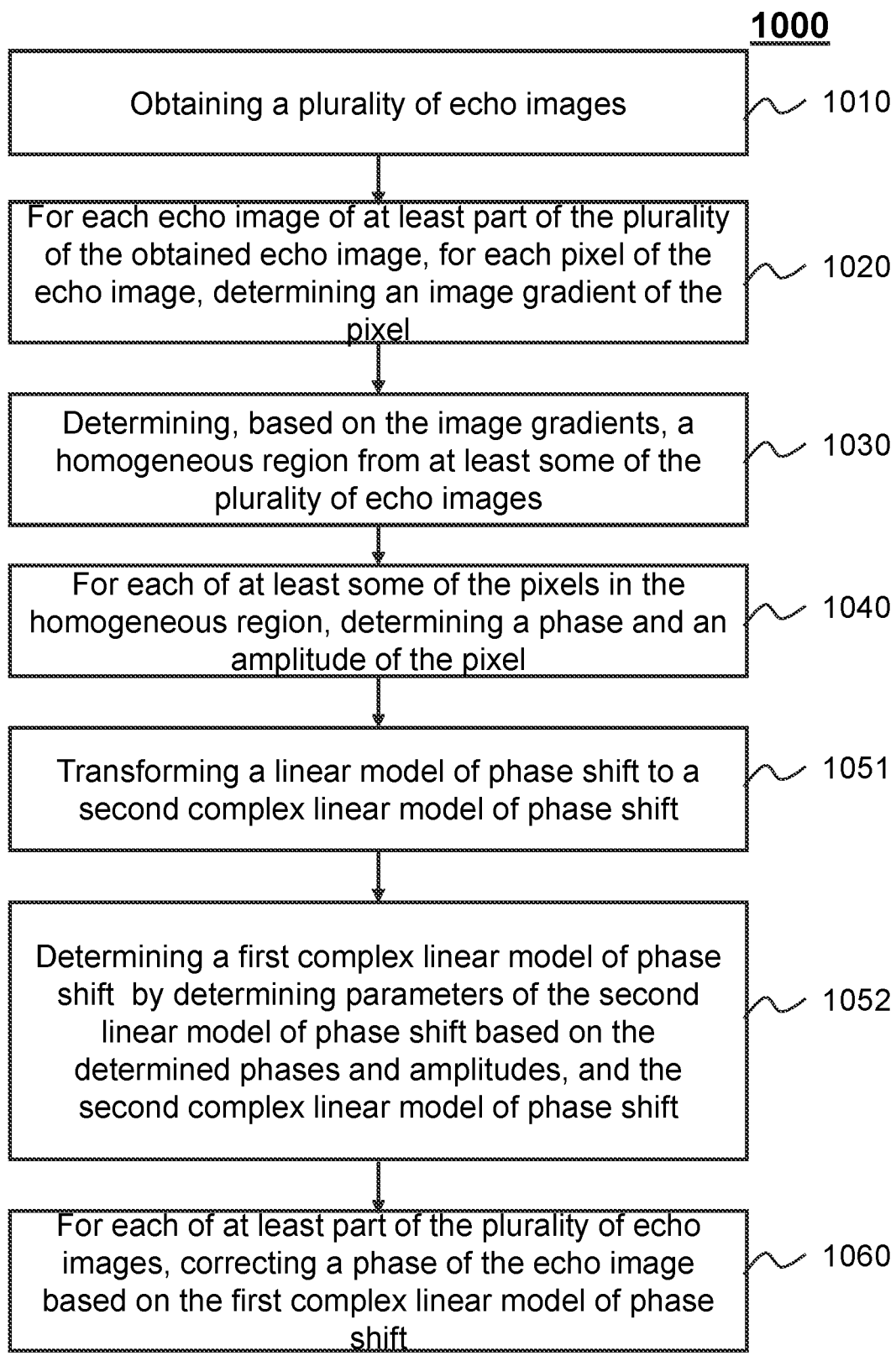
FIG. 10 is a flowchart illustrating an exemplary process for correcting phase according to some embodiments of the present disclosure.

FIG. 10 is a flowchart illustrating an exemplary process 1000 for correcting phase according to some embodiments of the present disclosure. At least a portion of process 1000 may be implemented in MRI system 100 as illustrated in FIG. 1 or in MRI system 200 as illustrated in FIG. 2. In some embodiments, one or more operations in process 1000 may be implemented on the computing device 300 as illustrated in FIG. 3 or mobile device 400. In some embodiments, one or more operations in process 1000 may be executed by phase correction device 210. In some embodiments, one or more operations in process 1000 may be stored in storage device 150 and/or another storage device (e.g., ROM 330, RAM 340, etc.) in the form of instructions, and invoked and/or executed by, e.g., phase correction device 210.

In 1010, first acquisition module 610 may obtain echo images. More description of operation 1010 may be found elsewhere in this disclosure, e.g., in operation 602 and the description thereof, and is not repeated here.

In 1020, for each echo image of at least some of the obtained plurality of the echo images, second acquisition module 620 may obtain an image gradient of each pixel of at least some pixels of the echo image. More description of operation 1020 may be found elsewhere in this disclosure, e.g., in 604 and the description thereof, and is not repeated here.

In 1030, third acquisition module 630 may determine a homogeneous region including homogeneous pixels in at least some of the plurality of echo images based on the image gradients. More description of operation 1030 may be found elsewhere in this disclosure, e.g., in 608 and the description thereof, and is not repeated here.

In 1040, for each of at least some of the pixels (homogeneous pixels) in the homogeneous region, fourth acquisition module 640 may obtain the phase and the amplitude of the pixel. More description of operation 1040 may be found elsewhere in this disclosure, e.g., in 610 and the description thereof, and is not repeated here.

In some embodiments, operations 1051 and 1052 may be performed to achieve operation 612 as described in connection with FIG. 6.

Figure 11:
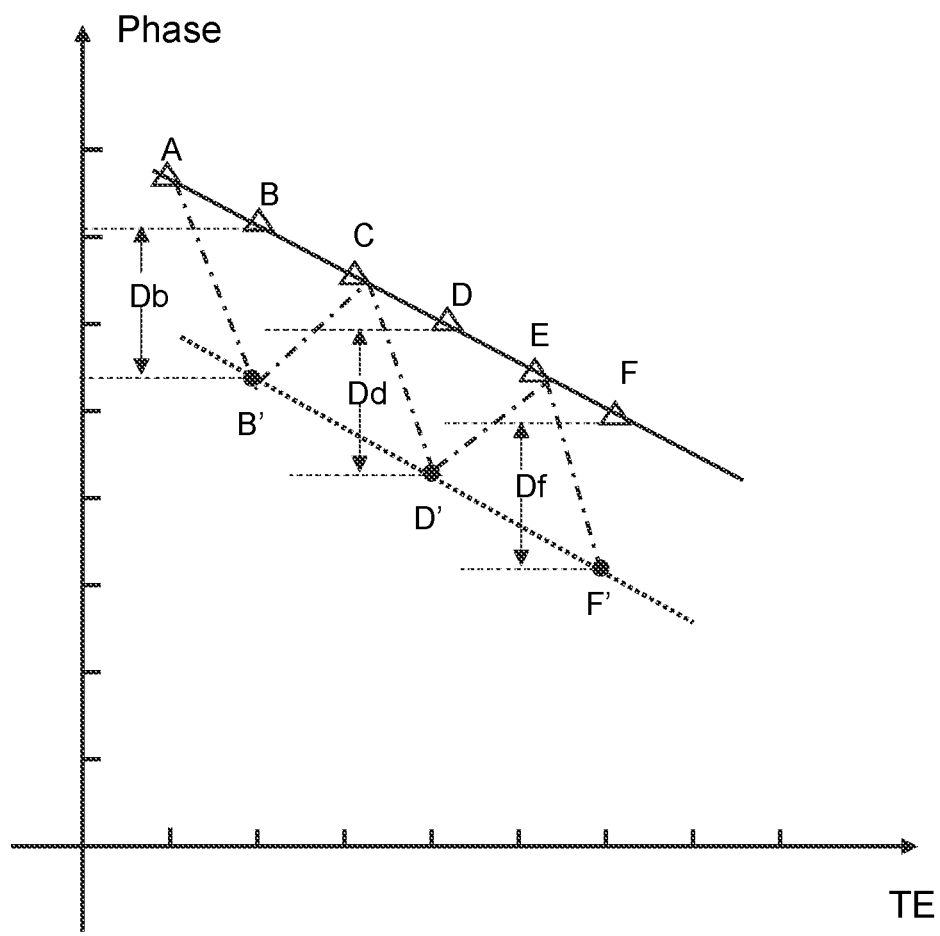
FIG. 11 is a schematic diagram of phases of a certain pixel in echo images corresponding to a repetition time (TR) according to some embodiments of the present disclosure.

As known to persons having ordinary skills in the art, in an ideal scenario, there may be a linear relationship among phases of pixels corresponding to a same spatial point in an imaging object in a plurality of echo images corresponding to a TR time period. The linear relationship may be shown as line L in FIG. 11. For example, the plurality of echo images may include six echo images that may be expressed as (the $1^{st}$ echo image, the $2^{nd}$ echo image, the $3^{rd}$ echo image, the $4^{th}$ echo image, the $5^{th}$ echo image, and the $6^{th}$ echo image). As illustrated in FIG. 11, points A, B, C, D, E, and F may respectively indicate phases of six pixels corresponding to a same spatial point in six echo images corresponding to a TR time period and may conform to the linear relationship shown as line L. However, due to, e.g., noises introduced by an eddy current, as shown in line B in FIG. 11, for each pixel in even echo images, there may be a phase shift. As illustrated in FIG. 11, points B', D' and F' may respectively indicate the shifted phases of three pixels corresponding to the same spatial point in the three even echo images, the $2^{nd}$ echo image, the $4^{th}$ echo image, and the $6^{th}$ echo image. In some embodiments, there may also be a linear relationship among shifted phases of pixels corresponding to a same spatial point in a plurality of even echo image. For example, points B', D', and F' may conform to a linear relationship shown as line M in FIG. 11. In some embodiments, phase shifts of certain pixels in different even echo images that correspond to a same spatial location may be the same. For example, the phase shift of a certain pixel in the $2^{nd}$ echo image may be represented by Db which indicates the phase difference between point B and point B'. The phase shift of the pixel corresponding to the same spatial location as the certain pixel in the $4^{th}$ echo image may be represented by Dd which indicates the difference between the phase of point D and point D'. The phase shift of the pixel corresponding to the same spatial location as the certain pixel in the $6^{th}$ echo image may be represented by Df which indicates the difference between the phase of point F and point F'. Db, Dd, and Df may be the same.

In general, the phase of a certain pixel in an echo image may be expressed as:

$$\varphi(r, TE_n) = \begin{cases} \varphi_0(r) - \gamma\Delta B(r)TE_n, & n = \text{odd number} \\ \varphi_0(r) - \gamma\Delta B(r)TE_n + \Delta\theta(r), & n = \text{even number} \end{cases} \quad (2)$$

where $\varphi(r, TE_n)$ refers to the phase of a pixel r in the nth echo image. As used herein, the position of r may also be described as (x, y, z). $\varphi_0(r)$ refers to an initial phase of the pixel r. $\gamma$ refers to the gyromagnetic ratio of a hydrogen nucleus. $\Delta B(r)$ refers to a change of the magnetic field during a scan performed in the MRI system (e.g., MRI system 100 as illustrated in FIG. 1 or MRI system 200 as illustrated in FIG. 2) in the position in the MRI system that corresponds to the pixel r. $\Delta\theta(r)$ refers to the phase shift of the pixel r. $TE_n$ refers to the echo time of the nth echo, where n refers to an integer no less than 1.

Based on the phases of the pixel r in consecutive echo images (e.g., in three consecutive echo images), the linear model of phase shift may be determined as:

$$2\Delta\theta(r) = 2\varphi(r,TE_e) - (\varphi(r,TE_{e-1}) + \varphi(r,TE_{e+1})), \quad (3)$$

where e is an even number larger than 1.

In operation 1051, determination module 650 may transform the linear model of phase shift to the second linear model of phase shift in the complex domain (also referred to as the second complex linear model of phase shift).

In some embodiments, the second complex linear model of phase shift may be expressed as:

$$D(r) = D(r,TE_e) * D(r,TE_e) * \text{conj}(D(r,TE_{e-1}) * D(r,TE_{e+1})), \quad (4)$$

where r refers to a pixel r, D(r) refers to a vector shift of the pixel, $D(r,TE_e)$ refers to a vector of the pixel in the eth echo image, where e is an even number, $TE_e$ refers to the echo time of the eth echo image, conj refers to a conjugate operation, $D(r,TE_{e-1})$ refers to a vector in the (e−1)th echo image, and $D(r,TE_{e+1})$ refers to a vector value in the (e+1)th echo image. D(r) may also be expressed in the form of a complex number:

$$D(r) = A * e^{i\theta}, \quad (5)$$

where A refers to the amplitude of pixel r, and $\theta$ refers to the phase of pixel r.

In 1052, determination module 650 may determine a first complex linear model of phase shift by determining parameters of the second complex linear model of phase shift based on the determined phases and amplitudes of pixels and the second complex linear model of phase shift. The first complex linear model of phase shift and the second complex linear model of phase shift as used herein are the same except that the first complex linear of phase shift model includes determined coefficients while the second complex linear model of phase shift includes unknown coefficients. In some embodiments, the second complex linear model of phase shift may be pre-stored in one or more components in MRI system 100 or MRI system 200, from which determination module 650 may retrieve or obtain the second linear model of phase shift. More description of the second complex linear model of phase shift may be found in, e.g., FIG. 12 and the description thereof, and is not repeated herein.

In some embodiments of the present disclosure, a complex linear model of phase shift may be used to construct a phase shift model, rather than a linear model of phase shift in the real domain as illustrated below.

As described elsewhere in the present disclosure, there may be a linear relationship between the phase shift of a certain pixel and the spatial location of the pixel. In some embodiments, the linear model of phase shift may be expressed as Equation (6) in the real domain:

$$A\theta(x,y,z) = ax + by + cz + d, \quad (6)$$

where x, y, and z refer to the coordinates of the pixel in the X direction, the Y direction, and the Z direction, respectively. a refers to a first-order coefficient of the linear model of phase shift and corresponds to the X direction. b is a first-order coefficient of the linear model of phase shift and corresponds to the Y direction. c is a first-order coefficient of the linear model of phase shift and corresponds to the Z direction. d refers to a zeroth-order coefficient of the linear model of phase shift.

The coefficients a, b, c, and d may be unknown. In some embodiments, the first-order coefficients of the linear model of phase shift (e.g., a, b, and c) may be determined based on differences between phase shifts of specific pixels and their respective neighboring pixels that are next to each of the specific pixels in corresponding directions. For example, a, which corresponds to the X direction, may be determined based on differences between phase shifts of specific pixels and pixels that are next to each of the specific pixels in the X direction. For example, to determine the coefficient a, a first-order candidate coefficient $a_i$ corresponding to the ith pixel in an echo image may be determined. The first-order candidate coefficient $a_i$ may be determined based on a difference between the ith pixel, which may be expressed as pixel r1(x, y, z) and the neighboring pixel next to the ith pixel in the X direction, which may be expressed as r2(x−1, y, z), as illustrated below:

$$a_i = \Delta\theta(r1) - \Delta\theta(r2) = (ax+by+cz+d) - [a(x-1)+by+cz+d]. \quad (7)$$

For a plurality of pixels in the echo images, which may be expressed as ($1^{st}$ pixel, $2^{nd}$ pixel, $3^{rd}$ pixel, . . . , ith pixel, . . . , nth pixel), a plurality of first-order candidate coefficients may be determined accordingly, which may be expressed as ($a_1$, $a_2$, $a_3$, . . . , $a_i$, . . . $a_n$). i and n may be integers no less than 1. Further, an average of all first-order candidate coefficients may be described as:

$$\bar{a} = \frac{1}{N}\sum a_i. \quad (8)$$

In some embodiments, the first-order coefficient a of the linear model of phase shift may be determined to be the average of all first-order candidate coefficients. Similarly, b may be determined based on differences between phase shifts of specific pixels and pixels that are next to each of the specific pixels in the Y direction. c may be determined based on differences between phase shifts of specific pixels and pixels that are next to each of the specific pixels in the Z direction. The zeroth-order coefficient d may also further be determined, for example, based on phase shifts of certain pixels and the determined first-order coefficients a, b, and c.

The above process, however, uses phases of pixels in the real domain to determine the coefficients of the linear model of phase shift, which may result in an error in the determined coefficients due to, e.g., phase wrapping of some pixels. During processing of pixels, the phase of a pixel may wrap when it is larger than a third threshold (e.g., $\pi$) or smaller than a fourth threshold (e.g., $-\pi$), which may result in an erroneous phase of the pixel. Coefficients determined based on the erroneous phases of pixels may be inaccurate. For example, a pixel with a phase of −185° may be improperly processed as a pixel with a phase of (−185°±2$\pi$) due to its wrapping, which results in an error in the determination of coefficients. Although, an unwrapping operation may be performed on pixels with phase wrapping to avoid errors in the coefficients of the linear model of phase shift in the real domain, the unwrapping operation may be time-consuming, and lower the efficiency of a phase correction process.

In 1060, for each of at least part of the plurality of echo images, correction module 660 may correct a phase of the echo image based on the first complex linear model of phase shift. More description of operation 1060 may be found elsewhere in this disclosure, e.g., in 614 and the description thereof, and is not repeated here.

Figure 12:
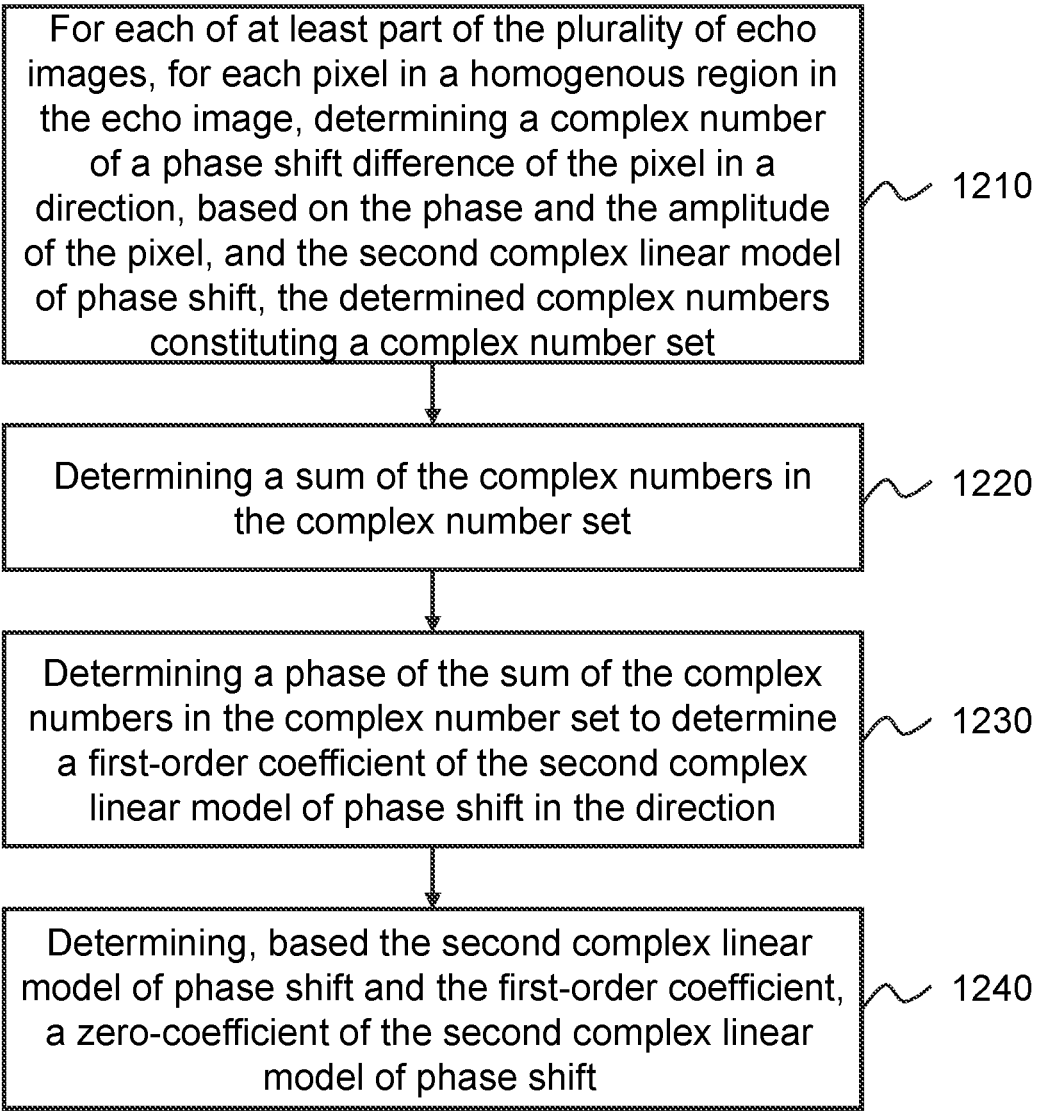
FIG. 12 is a flowchart illustrating an exemplary process for determining a first complex linear model of phase shift according to some embodiments of the present disclosure.

FIG. 12 is a flowchart illustrating an exemplary process 1200 for determining a first complex linear model of phase shift according to some embodiments of the present disclosure. At least a portion of process 1200 may be implemented in MRI system 100 as illustrated in FIG. 1 or in MRI system 200 as illustrated in FIG. 2. In some embodiments, one or more operations in process 1200 may be executed by phase correction device 210. In some embodiments, one or more operations in process 1200 may be implemented on the computing device 300 as illustrated in FIG. 3 or mobile device 400. In some embodiments, one or more operations in process 1200 may be stored in storage device 150 and/or another storage device (e.g., ROM 330, RAM 340, etc.) in the form of instructions, and invoked and/or executed by, e.g., phase correction device 210. In some embodiments, one or more operations in FIG. 12 may be performed to achieve operation 1052 as described in connection with FIG. 15.

In 1210, for each of at least part of the plurality of echo images, for each pixel of at least some pixels in a homogenous region in the echo image, determination module 650 may determine a phase shift difference of the pixel in the complex form (or referred to as a complex number) in a direction, based on the phases and the amplitudes of the pixel and its neighboring pixel in the direction, and the second complex linear model of phase shift. The determined complex numbers may constitute a complex number set. As used herein, the phase shift difference of a certain pixel in a direction may refer to the difference between the phase shift of the certain pixel and the phase shift of its neighboring pixel that is next to the certain pixel in the direction. In some embodiments, the phase shift difference of a certain pixel in a direction may be expressed as a complex number. See, e.g., Equation (9) and the description thereof. The complex number set may include a set of complex numbers. In some embodiments, the phase shift differences in a complex number set may correspond to a same direction. Accordingly, the complex number set may correspond to that direction.

In some embodiments, the complex number indicating the difference between phase shifts of pixel (x, y, z) and its neighboring pixel in the X direction, pixel (x−1, y, z), may be determined according to:

$$Dx=D(x,y,z)*\mathrm{conj}(D(x-1,y,z)), \qquad (9)$$

where Dx is the complex number representing the difference in the phase shift between pixel (x, y, z) and pixel (x−1, y, z). Dx may also be referred to as a first-order candidate coefficient in the X direction in the complex domain. D(x, y, z) refers to the phase shift of the pixel (x, y, z), and D(x−1, y, z) refers to the phase shift of the neighboring pixel (x−1, y, z) that is next to the pixel (x, y, z) in the X direction. conj refers to a conjugate operation. In some embodiments, D(x, y, z) and the D(x−1, y, z) may be obtained according to the second complex linear model of phase shift illustrated in Equation (4).

In some embodiments, for a plurality of pixels in a homogeneous region, determination module 650 may determine a plurality of first-order candidate coefficients in the X direction in the complex domain accordingly, which may be expressed as a plurality of complex numbers. The plurality of complex numbers may constitute a complex number set corresponding to the X direction.

In 1220, determination module 650 may determine a sum of the complex numbers in the complex number set. For example, as described in connection with operation 1210, the complex number set includes a set of complex numbers, each representing a first-order candidate coefficient of the second complex linear model of phase shift in the X direction. Determination module 650 may determine a sum of the complex numbers in the complex number set, the sum being corresponding to the X direction.

In 1230, determination module 650 may determine the phase of the sum of the complex numbers in the complex number set to determine a first-order coefficient of the second complex linear model of phase shift in the direction. As used herein, a first-order coefficient of the second complex linear model of phase shift in the direction may be referred to as a first-order target coefficient in the direction, or simply referred to as a first-order coefficient in the direction.

In 1240, determination module 650 may determine a zeroth-order coefficient of the second complex linear model of phase shift based on the second complex linear model of phase shift and the first-order coefficients.

In some embodiments, determination module 650 may perform operations 1210 to 1220 iteratively to obtain the first-order coefficients a, b, and c that correspond to the X direction, the Y direction, and the Z direction, respectively. Determination module 650 may further determine a candidate zeroth-order coefficient set in complex domain according to:

$$D_0=D(x,y,z)*\exp(-1i(ax+by+cz)). \qquad (10)$$

Further, determination module 650 may determine a sum of the candidate zeroth-order coefficient set in the complex domain to determine the zeroth-order coefficient d, to determine the first complex linear model of phase shift accordingly.

In some embodiments, the phase of a pixel may wrap when it is larger than a third threshold (e.g., $\pi$) or smaller than a fourth threshold (e.g., $-\pi$), which results in an erroneous phase of the pixel. The erroneous phase does not influence the determination of coefficients of the second complex linear model of phase shift (coefficients of the first complex linear model of phase shift) due to the use of Euler's formula. For example, although a pixel with a phase of −185° may be improperly processed as a pixel with a phase of (−185°+2n) due to its wrapping, since $e^{i\theta}=e^{i(\theta+2\pi)}$, the wrapping of the pixel does not introduce errors in the determination of the coefficients of the second complex linear model of phase shift with reference to Equation (5) and Equation (9).

In some embodiments, process 1200 for determining a complex number set corresponding to the X direction is provided for illustration purposes. Similarly, process 1200 may also be used to determine a complex number set including phase shift differences corresponding to other directions such as the Y direction, or the Z direction, a description of which is not repeated here.

Figure 13:
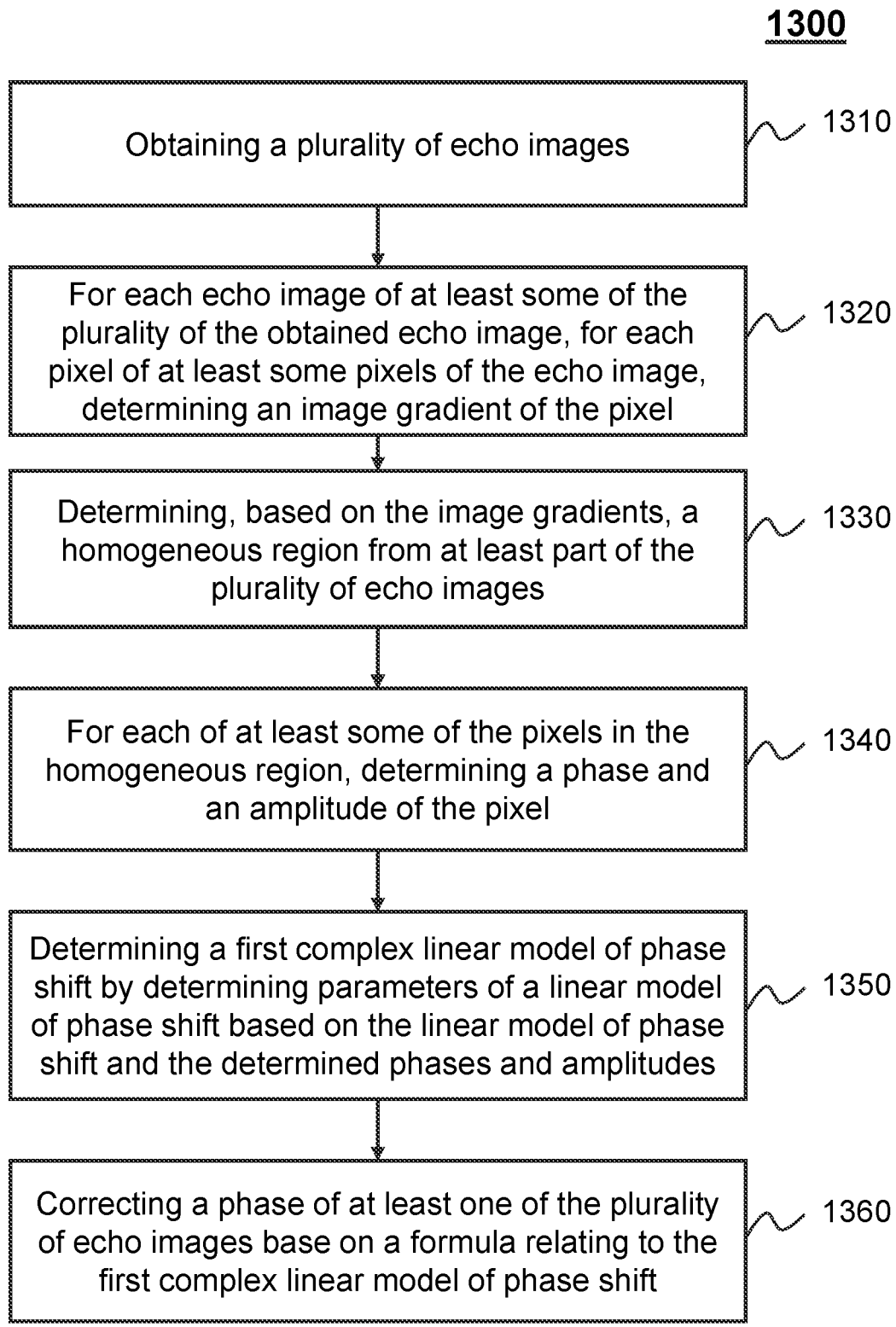
FIG. 13 is a flowchart illustrating an exemplary process for correcting phase according to some embodiments of the present disclosure.

FIG. 13 is a flowchart illustrating an exemplary process 1300 for phase correction according to some embodiments of the present disclosure. At least a portion of process 1300 may be implemented in MRI system 100 as illustrated in FIG. 1 or in MRI system 200 as illustrated in FIG. 2. In some embodiments, one or more operations in process 1300 may be executed by phase correction device 210. In some embodiments, one or more operations in process 1300 may be implemented on the computing device 300 as illustrated in FIG. 3 or mobile device 400. In some embodiments, one or more operations in process 1000 may be stored in storage device 150 and/or another storage (e.g., ROM 330, RAM 340, etc.) in the form of instructions, and invoked and/or executed by, e.g., phase correction device 210.

In 1310, first acquisition module 610 may obtain echo images. More description of the operation 1310 may be found elsewhere in this disclosure, e.g., in operation 602 and the description thereof, and is not repeated here.

In 1320, for each echo image of at least some of the obtained plurality of the echo images, second acquisition module 620 may obtain an image gradient of each pixel of at least some pixels of the echo image. More description of operation 1320 may be found elsewhere in this disclosure, e.g., in 604 and the description thereof, and is not repeated here.

In 1330, third acquisition module 630 may determine a homogeneous region in at least some of the plurality of echo images based on the image gradients. More description of operation 1330 may be found elsewhere in this disclosure, e.g., in 608 and the description thereof, and is not repeated here.

In 1340, for each of at least some of the pixels in the homogeneous region, fourth acquisition module 640 may obtain the phase and the amplitude of the pixel. More description of operation 1340 may be found elsewhere in this disclosure, e.g., in 610 and the description thereof, and is not repeated here.

In 1350, determination module 650 may determine a first complex linear model of phase shift. In some embodiments, determination module 650 may determine the first complex linear model of phase shift by determining parameters of a linear model of phase shift based on the determined phases and amplitudes of pixels of the homogeneous region.

In 1360, correction module 660 may correct the phase of at least one of the plurality of echo images base on a formula relating to the first complex linear model of phase shift. An example of such a formula may be expressed as below:

$$\varphi^{corr}(r, TE_n) = \begin{cases} \varphi(r, TE_n), & n = \text{odd number} \\ \varphi(r, TE_n) * \exp(-1i*(ax+by+cz+d)), & n = \text{even number} \end{cases} \quad (11)$$

where r refers to a specific pixel, $\varphi^{corr}(r, TE_n)$ refers to a corrected phase of the pixel, $\varphi(r, TE_n)$ refers to an initial phase of the pixel, $\exp(-1i*(ax+by+cz+d))$ refers to the first complex linear model of phase shift, a refers to a first-order coefficient in the X direction, b refers to the first-order coefficient in the Y direction, c refers to the first-order coefficient in the Z direction, and d refers to the zeroth-order coefficient of the first complex linear model of phase shift.

It should be noted that the above descriptions of process 1300 are provided for the purposes of illustration, and not intended to limit the scope of the present disclosure. For persons having ordinary skills in the art, various modifications and changes in the forms and details of the application of the above method and system may occur without departing from the principles in the present disclosure. However, those variations and modifications also fall within the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure, and are within the spirit and scope of the exemplary embodiments of the present disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method implemented on at least one machine each of which has at least one processor and at least one storage device, the method comprising:
    obtaining a plurality of echo images;
    identifying homogeneous pixels in the plurality of echo images based on image gradients of pixels in the plurality of echo images;
    determining a vector corresponding to each of at least some of the identified homogeneous pixels, a vector of a homogenous pixel including a phase element and an amplitude element;
    determining a first complex linear model of phase shift based at least in part on the determined vectors, including:
        obtaining a linear model of phase shift;
        transforming the linear model of phase shift to a second complex linear model;
        determining at least one parameter of the second complex linear model based on the determined vectors; and
        determining the first complex linear model based on the second complex linear model and the at least one parameter; and
    correcting, based on the first complex linear model, phase shift of at least one of the plurality of echo images.

2. The method of claim 1, wherein the identified homogeneous pixels belong to a homogeneous region.

3. The method of claim 1, wherein the identifying homogeneous pixels in the plurality of echo images comprises:
    for each pixel of at least some pixels of an echo image of the plurality of echo images,
        obtaining an image gradient of the pixel; and
        determining whether the pixel is a homogeneous pixel based on the image gradient of the pixel and a threshold.

4. The method of claim 3, wherein the obtaining an image gradient of the pixel comprises:
    obtaining a first image gray value of the pixel;
    obtaining a second image gray value of a neighboring pixel of the pixel in a first direction, a third image gray value of a neighboring pixel of the pixel in a second direction, and a fourth image gray value of a neighboring pixel of the pixel in a third direction; and
    determining a first image gradient element of the pixel in the first direction based on a difference between the first image gray value and the second image gray value;
    determining a second image gradient element of the pixel in the second direction based on a difference between the first image gray value and the third image gray value;
    determining a third image gradient element of the pixel in the third direction based on a difference between the first image gray value and the fourth image gray value; and
    determining the image gradient of the pixel based on the first image gradient element, the second image gradient element, and the third image gradient element.

5. The method of claim 1, wherein the plurality of echo images include a first pixel and a second pixel, and the identifying homogeneous pixels in the plurality of echo images comprises:
    obtaining a first image gradient of the first pixel;
    obtaining a second image gradient of the second pixel; and
    determining whether the first pixel and the second pixel are homogeneous pixels by comparing a difference between the first image gradient and the second image gradient with a threshold.

6. The method of claim 1, wherein the determining the first complex linear model further comprises:
    determining at least one parameter of the linear model of phase shift based on the determined vectors; and
    determining the first complex linear model based on the linear model and the at least one parameter.

7. The method of claim 1, wherein the at least one parameter of the second complex linear model comprises at least one first-order coefficient, and the determining at least one parameter of the second complex linear model based on the determined vectors comprises:
    determining, based on the second complex linear model and the determined vectors, a plurality of complex numbers, each complex number corresponding to a homogeneous pixel;
    determining a phase corresponding to a sum of the plurality of complex numbers; and determining the at least one first-order coefficient of the second complex linear model based on the determined phase.

8. The method of claim 7, wherein the at least one parameter of the second complex linear model further comprises a zeroth-order coefficient, and the method further comprises:
determining the zeroth-order coefficient of the second complex linear model based on the determined at least one first-order coefficient of the second complex linear model.

9. A system, comprising:
at least one computer-readable storage medium including a set of instructions; and
at least one processor in communication with the at least one computer-readable storage medium, wherein when executing the instructions, the at least one processor is directed to:
obtain a plurality of echo images;
identify homogeneous pixels in the plurality of echo images based on image gradients of pixels in the plurality of echo images;
determine a vector corresponding to each of at least some of the identified homogeneous pixels, a vector of a homogenous pixel including a phase element and an amplitude element;
determine a first complex linear model of phase shift based at least in part on the determined vectors, includes:
obtain a linear model of phase shift;
transform the linear model of phase shift to a second complex linear model;
determine at least one parameter of the second complex linear model based on the determined vectors; and
determine the first complex linear model based on the second complex linear model and the at least one parameter; and
correct, based on the first complex linear model, phase shift of at least one of the plurality of echo images.

10. The system of claim 9, wherein the identified homogeneous pixels belong to a homogeneous region.

11. The system of claim 9, wherein to identify the homogeneous pixels in the plurality of echo images, the at least one processor is directed to:
for each pixel of at least some pixels of an echo image of the plurality of echo images,
obtain an image gradient of the pixel; and
determine whether the pixel is a homogeneous pixel based on the image gradient of the pixel and a threshold.

12. The system of claim 9, wherein the plurality of echo images include a first pixel and a second pixel, and wherein to identify the homogeneous pixels in the plurality of echo images, the at least one processor is directed to:
obtain a first image gradient of the first pixel;
obtain a second image gradient of the second pixel; and
determine whether the first pixel and the second pixel are homogeneous pixels by comparing a difference between the first image gradient and the second image gradient with a threshold.

13. The system of claim 9, wherein to determine the first complex linear model, the at least one processor is further directed to:
determine at least one parameter of the linear model of phase shift based on the determined vectors; and
determine the first complex linear model based on the linear model and the at least one parameter.

14. The system of claim 9, wherein the at least one parameter of the second complex linear model comprises at least one first-order coefficient, and wherein to determine the at least one parameter of the second complex linear model based on the determined vectors, the at least one processor is directed to:
determine, based on the second complex linear model and the determined vectors, a plurality of complex numbers, each complex number corresponding to a homogeneous pixel;
determine a phase corresponding to a sum of the plurality of complex numbers; and
determine the at least one first-order coefficient of the second complex linear model based on the determined phase.

15. The system of claim 14, wherein the at least one parameter of the second complex linear model further comprises a zeroth-order coefficient, and the at least one processor is further directed to:
determine the zeroth-order coefficient of the second complex linear model based on the determined at least one first-order coefficient of the second complex linear model.

16. A non-transitory computer readable medium including executable instructions that, when executed by at least one processor, cause the at least one processor to effectuate a method comprising:
obtaining a plurality of echo images;
identifying homogeneous pixels in the plurality of echo images based on image gradients of pixels in the plurality of echo images;
determining a vector corresponding to each of at least some of the identified homogeneous pixels, a vector of a homogenous pixel including a phase element and an amplitude element;
determining a first complex linear model of phase shift based at least in part on the determined vectors, including:
obtaining a linear model of phase shift;
transforming the linear model of phase shift to a second complex linear model;
determining at least one parameter of the second complex linear model based on the determined vectors; and
determining the first complex linear model based on the second complex linear model and the at least one parameter; and
correcting, based on the first complex linear model, phase shift of at least one of the plurality of echo images.

* * * * *